(12) United States Patent
Park et al.

(10) Patent No.: US 8,563,143 B2
(45) Date of Patent: Oct. 22, 2013

(54) ORGANIC ELECTROLUMINESCENCE DEVICE AND METHOD FOR FABRICATING THE SAME

(75) Inventors: Sang Tae Park, Gyeonggi-do (KR); Myung Seop Kim, Seoul (KR); Jeong Dae Seo, Gyeonggi-do (KR); Eun Soo Cha, Gyeonggi-do (KR); Jae Man Lee, Seoul (KR); Chang Je Sung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 935 days.

(21) Appl. No.: 11/357,945

(22) Filed: Feb. 22, 2006

(65) Prior Publication Data

US 2007/0020483 A1  Jan. 25, 2007

(30) Foreign Application Priority Data

Jul. 25, 2005  (KR) .................. 10-2005-0067300

(51) Int. Cl.
  *H01L 51/54* (2006.01)
(52) U.S. Cl.
  USPC ............... 428/690; 428/917; 427/58; 427/66; 313/502; 313/504; 257/40
(58) Field of Classification Search
  USPC .................................................. 428/690
  See application file for complete search history.

(56) References Cited

U.S. PATENT DOCUMENTS

| | | | | |
|---|---|---|---|---|
| 6,064,151 | A | 5/2000 | Choong et al. | 313/504 |
| 6,420,031 | B1* | 7/2002 | Parthasarathy et al. | 428/411.1 |
| 6,627,333 | B2 | 9/2003 | Hatwar | 428/690 |
| 6,717,358 | B1* | 4/2004 | Liao et al. | 313/504 |
| 6,750,608 | B2* | 6/2004 | Matsuura et al. | 313/504 |
| 2001/0009690 | A1* | 7/2001 | Choong et al. | 427/66 |
| 2001/0052751 | A1* | 12/2001 | Wakimoto et al. | 313/504 |
| 2002/0081456 | A1* | 6/2002 | Hamada | 428/690 |
| 2002/0086180 | A1* | 7/2002 | Seo et al. | 428/690 |
| 2004/0075384 | A1* | 4/2004 | Aoki | 313/506 |
| 2004/0142207 | A1 | 7/2004 | Wang | 428/690 |
| 2004/0185297 | A1 | 9/2004 | Klubek et al. | 428/690 |
| 2004/0207318 | A1* | 10/2004 | Lee et al. | 313/506 |
| 2004/0253413 | A1* | 12/2004 | Baba et al. | 428/141 |
| 2005/0074629 | A1 | 4/2005 | Forrest et al. | 428/690 |
| 2005/0116633 | A1 | 6/2005 | Yamazaki et al. | 313/506 |
| 2007/0020484 | A1* | 1/2007 | Kim et al. | 428/690 |

FOREIGN PATENT DOCUMENTS

| | | | | |
|---|---|---|---|---|
| CN | 1217582 | A | 5/1999 | |
| CN | 1378409 | A | 11/2002 | |
| CN | 1438828 | A | 8/2003 | |
| EP | 1 220 339 | A2 | 7/2002 | H01L 51/20 |
| EP | 1 220 340 | A2 | 7/2002 | H01L 51/20 |
| JP | 2002-313583 | A | 10/2002 | |
| JP | 2003-272860 | A | 9/2003 | |
| JP | 2004-207000 | A | 7/2004 | |
| JP | 2004-311231 | A | 11/2004 | |
| JP | 2004-319424 | A | 11/2004 | |
| JP | 2005-123094 | A | 5/2005 | |
| JP | 2005-183213 | A | 7/2005 | |
| JP | 2005-190998 | A | 7/2005 | |

OTHER PUBLICATIONS

Extended European Search Report dated Sep. 5, 2011 in corresponding European Patent Application No. 06003606.8.

* cited by examiner

*Primary Examiner* — Gerard Higgins
*Assistant Examiner* — Andrew K Bohaty
(74) *Attorney, Agent, or Firm* — Morgan, Lewis & Bockius LLP

(57) ABSTRACT

An organic electroluminescent (EL) device having improved efficiency and service life is provided. The organic electroluminescent device has a stack structure including an emitting layer and an electron-transport layer positioned between an anode and a cathode. The electron-transport layer includes a first layer adjacent to the emitting layer which may be a mixture of at least two materials, and a second layer adjacent to the cathode which may be a mixture of at least two materials. The mixture of at least two materials may be a mixture of an organic compound and one or more other organic compounds, or may be a mixture of a metal or inorganic compound and one or more other metal or inorganic compounds, or may be a mixture of one or more organic compounds and one or more metal or inorganic compounds.

7 Claims, 30 Drawing Sheets

Balq [aluminum(lll) bis(2-methyl-8-quinolinato) 4-phenylphenolate]

BCP [2,9-Dimethyl-4,7-diphenyl-1,10-phenanthroline]

CBP [4,4'-N,N'-dicarbazole-1,1'-biphenyl]

CF-X

CF-Y oxidiazole derivative triazole derivative thiophene derivative pyrrole derivative sila-cyclopentadiene derivative anthracene derivative pyrene derivative perylene derivative Alq3[Tris-(8-hydroxyquinolinolato)-aluminium]

BeBq2[bis(10-hydroxybenzofhgqinolinato)beryllium]

BeBq2[bis(10-hydroxybenzo[h]quinolinato)beryllium]

Zn(oxz)2 [Bis(2-(hydroxyphenyl)-benz-1,3,oxadizaoleato)zinc]

PBD[2-(4-biphenylyl)-5-(4-tert-butyl-phenyl)-1,3,4-oxadiaxole]

TAZ[3-(4-Biphenyly)-4-phenyl-5-tert-butylphenyl-1,2,4-triazole]

Liq[8-Quinolinolato Lithium]

Mgq2 [Bis(8-Quinolinolato) Magnesium]

Znq2 [Bis(8-Quinolinolato) Zinc]

FIG.10

| Al(Cathode)-150nm |
| --- |
| LiF(EIL)-0.5nm |
| Balq:Alq3-35nm |
| Alq3+C545T(EML)-25nm |
| NPD(HTL)-35nm |
| CuPC(HIL)-25nm |
| ITO(Anode)-150nm |
| Substrate |

FIG.13

| Al(Cathode)-150nm |
| --- |
| LiF(EIL)-0.5nm |
| Balq:BeBq2-35nm |
| Alq3+C545T(EML)-25nm |
| NPD(HTL)-35nm |
| CuPC(HIL)-25nm |
| ITO(Anode)-150nm |
| Substrate |

Changes in work function

Shifts in HOMO level

Changes in work function

Shifts in HOMO level

ORGANIC ELECTROLUMINESCENCE DEVICE AND METHOD FOR FABRICATING THE SAME

This application claims the benefit of Korean Patent Application No. 10-2005-0067300, filed on Jul. 25, 2005, which is hereby incorporated by reference as if fully set forth herein.

BACKGROUND OF THE INVENTION

1. Field of the Invention

The present invention relates to an organic electroluminescent (EL) device, and more particularly, to an organic electroluminescent device having an electron-transport layer and a method for fabricating the same.

2. Background of the Related Art

Generally, an organic electroluminescent (EL) device includes a stack of organic layers, each layer having a function related to an anode made of materials such as indium tin oxide (ITO) and a cathode made of materials such as aluminum (Al). An electric field is applied to the stack to emit light. Organic EL devices are characterized by the capability to be driven at a low voltage with relatively low consumption of electric power, while having a light-weight and flexible substrate.

Conventional organic EL devices exhibit significant variation in service life and efficiency, depending upon materials and stack structures used therein, as well as surface treatment conditions of anodes. Although significant effort has been expended in an attempt to improve service life and efficiency of conventional organic EL devices, substantially no satisfactory results of such research have been achieved, and service life and efficiency of organic EL devices remain a problem.

SUMMARY OF THE INVENTION

An object of the invention is to solve at least the above problems and/or disadvantages and to provide at least the advantages described hereinafter.

Accordingly, the present invention is directed to an organic electroluminescent device and a method for fabricating the same that substantially obviate one or more problems due to limitations and disadvantages of the related art.

An object of the present invention is to provide an organic electroluminescent device having an improved service life and efficiency via formation of an electron-transport layer utilizing a novel material, and a method for fabricating the same.

Another object of the present invention is to provide an organic electroluminescent device utilizing a simplified manufacturing process via formation of an electron-transport layer utilizing a novel material, and a method for fabricating the same.

To achieve these objects and other advantages and in accordance with the invention, as embodied and broadly described herein, an organic electroluminescent device includes a stack structure including an emitting layer and an electron-transport layer between an anode and a cathode, wherein the electron-transport layer includes a first layer adjacent to the emitting layer which is a mixture of at least two materials and a second layer adjacent to the cathode which is a mixture of at least two materials, and the mixture of at least two materials may be a mixture of an organic compound and one or more other organic compounds, or may be a mixture of a metal or inorganic compound and one or more other metal or inorganic compounds, or may be a mixture of one or more organic compounds and one or more metal or inorganic compounds.

The first layer or the second layer of the electron-transport layer may be of a mixture of a first material and a second material, and a composition ratio of the first material (X) to the second material (Y) may be in the range of 1-100:1 and 1:1-100.

In addition, the first layer or the second layer of the electron-transport layer may be a mixture of a first material and plural materials, and a composition ratio of the first material (X) to the plural materials (Y) may be in the range of 1-100:1 and 1:1-100.

The first layer of the electron-transport layer may contain at least one material having hole-blocking properties and at least one material having electron-transporting properties, and the second layer of the electron-transport layer may contain at least one material having electron-transporting properties and at least one material having electron injection- or electron-transport-facilitating properties.

The material having hole-blocking properties may have an oxidation potential greater than 0.4V, and an absolute value of the Highest Occupied Molecular Orbital (HOMO) greater than 5.2 eV.

The material having electron-transporting properties may have a mobility of more than $1.0 \times 10^{-6}$ cm$^2$/Vs.

The material having electron injection or electron-transport-facilitating properties may be an inorganic compound or a metal.

A third layer composed of one or more sublayers may be further formed between the first layer and second layer of the electron-transport layer.

In another aspect of the present invention, a full-color organic electroluminescent (El) device comprises a stack structure including an emitting layer and an electron-transport layer between an anode and a cathode, wherein the emitting layer contains at least one phosphorescent material, and wherein the electron-transport layer may include a first layer adjacent to the emitting layer which is a mixture of at least one material having hole-blocking properties and at least one material having electron-transporting properties and a second layer adjacent to the cathode which is a mixture of at least one material having electron-transporting properties and at least one material having electron injection- or electron-transport-facilitating properties.

A third layer including one or more sublayers may be further formed between the first layer and second layer of the electron-transport layer, and the respective sublayers of the third layer may be a mixture of at least two materials selected from an organic compound, a metal compound and an inorganic compound, or may be a single material selected from an organic compound, a metal compound and an inorganic compound.

In a further aspect of the present invention, an organic electroluminescent device comprises a multiplicity of emitting units including an emitting layer and an electron-transport layer between an anode and a cathode, wherein the adjacent emitting units are separated by interlayers, and wherein the electron-transport layer may include a first layer adjacent to the emitting layer which is a mixture of at least one material having hole-blocking properties and at least one material having electron-transporting properties and a second layer adjacent to the cathode which is a mixture of at least one material having electron-transporting properties and at least one material having electron injection- or electron-transport-facilitating properties.

In yet another aspect of the present invention, a method for fabricating an organic electroluminescent device includes forming a first electrode on a substrate, forming an emitting layer containing at least one phosphorescent material on the first electrode, forming, over the entire emitting layer, an electron-transport layer made up of a first layer which is a mixture of at least one material having hole-blocking properties and at least one material having electron-transporting properties and a second layer which is a mixture of at least one material having electron-transporting properties and at least one material having electron injection- or electron-transport-facilitating properties, and forming a second electrode on the electron-transport layer.

It is to be understood that both the foregoing general description and the following detailed description of the present invention are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, wherein:

FIG. 10 is a structural section of an organic EL device having a Balq:Alq$_3$ electron-transport layer;

FIG. 13 is a sectional view of an organic EL device having a Balq:BeBq$_2$ electron-transport layer;

DETAILED DESCRIPTION OF PREFERRED EMBODIMENTS

Figure 1A:
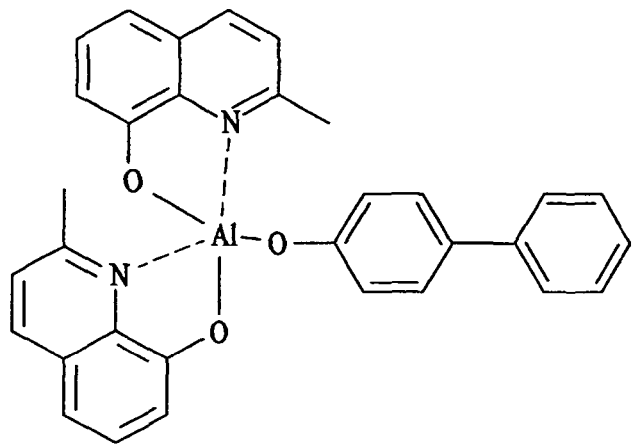
FIGS. 1a to 1e are structural formulae of hole-blocking materials used in an electron-transport layer of an organic EL device in accordance with an embodiment of the present invention.
Figure 1B:
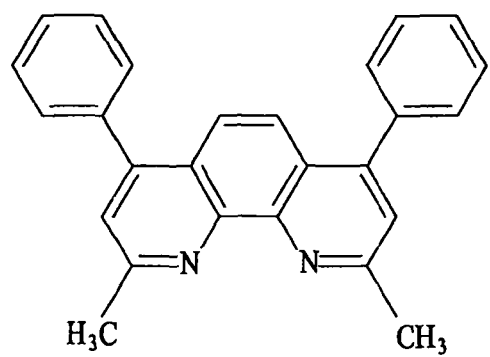
Figure 1C:
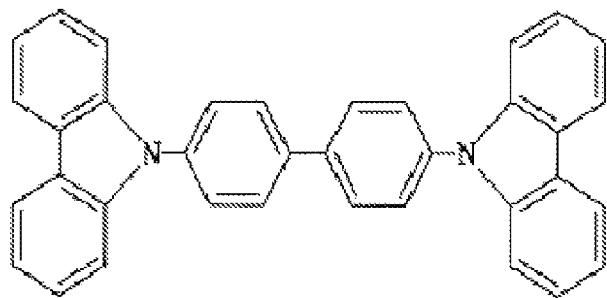
Figure 1D:
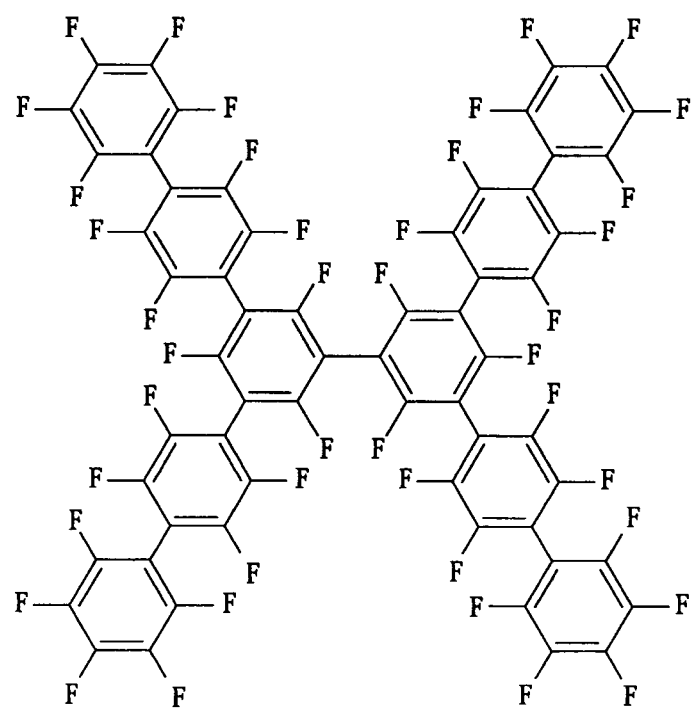
Figure 1E:
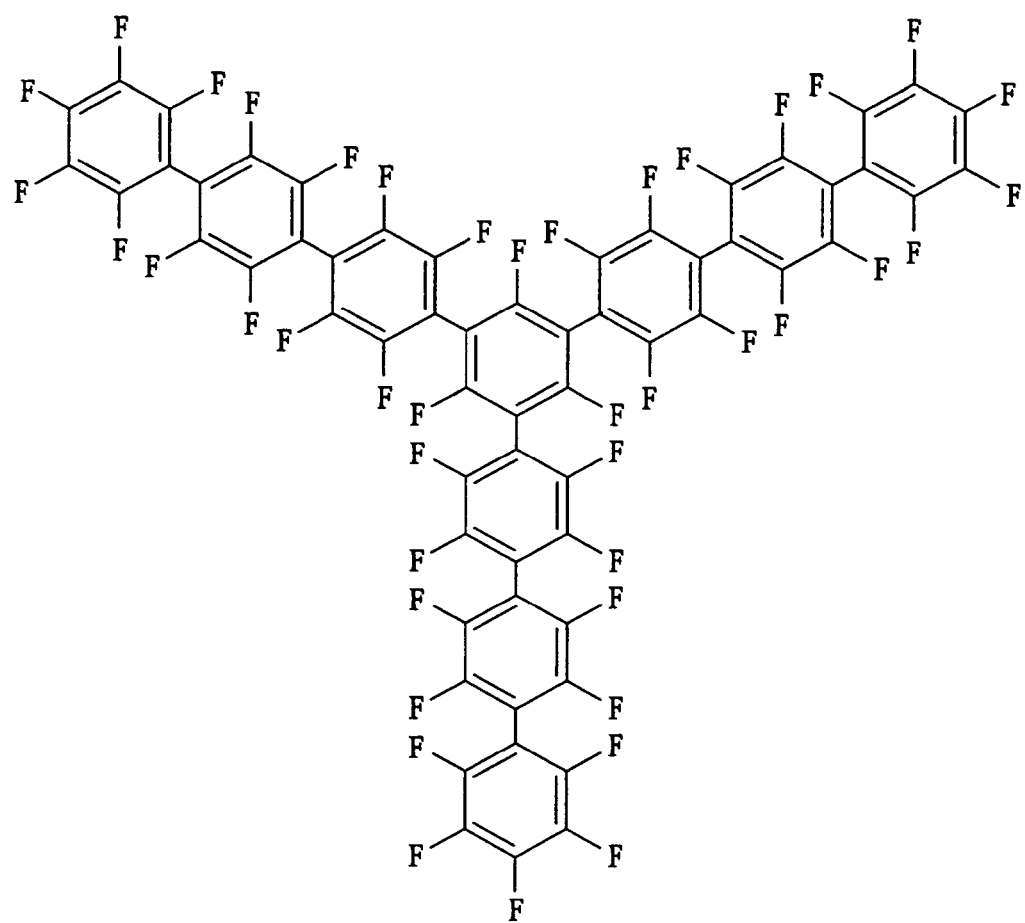
Figure 2A:
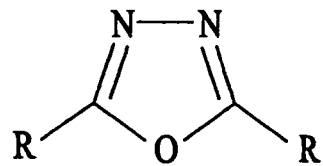
FIGS. 2a to 2h are structural formulae of derivatives used in an electron-transport layer of an organic EL device in accordance with an embodiment of the present invention.
Figure 2B:
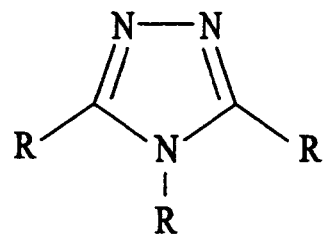
Figure 2C:
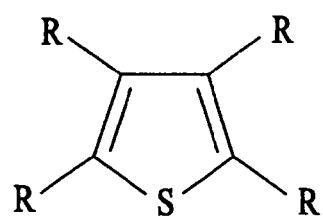
Figure 2D:
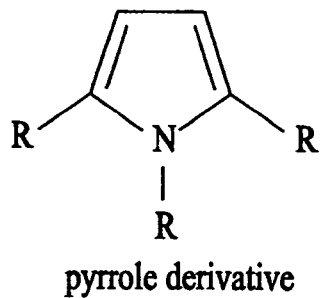
Figure 2E:
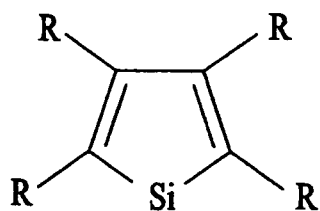
Figure 2F:
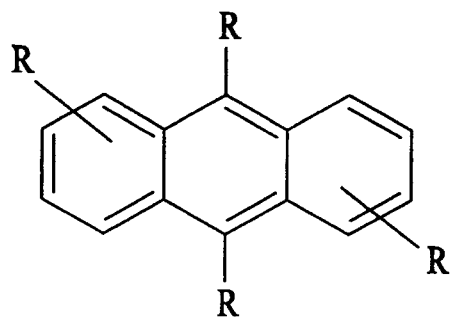
Figure 2G:
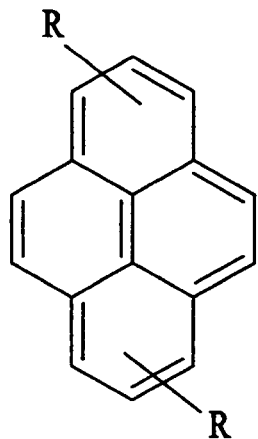
Figure 2H:
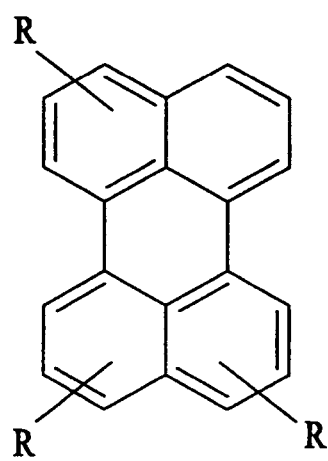
Figure 3A:
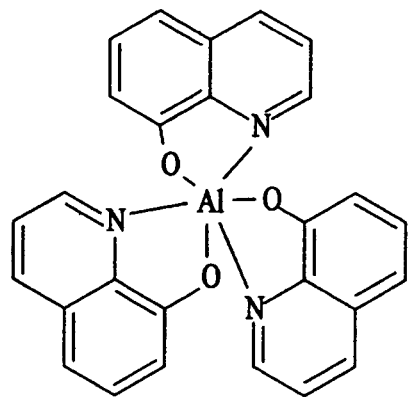
FIGS. 3a to 3h are structural formulae of electron-transporting materials used in an electron-transport layer of an organic EL device in accordance with an embodiment of the present invention.
Figure 3B:
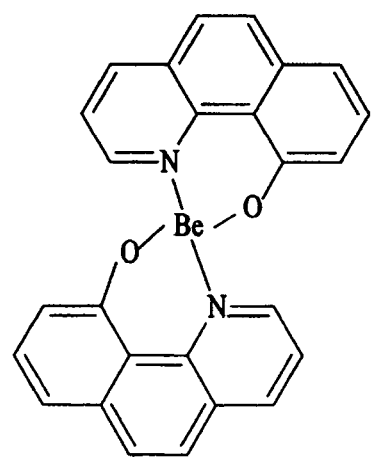
Figure 3B:
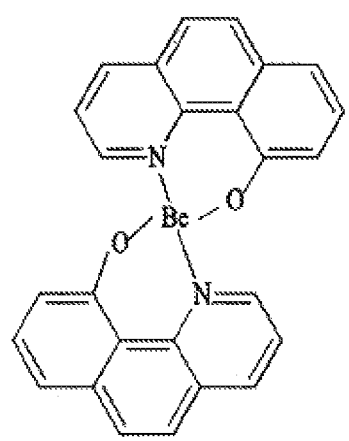
Figure 3C:
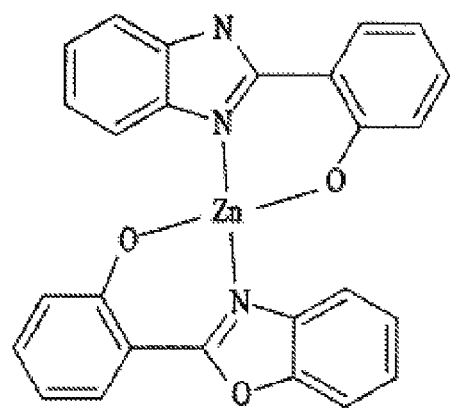
Figure 3D:
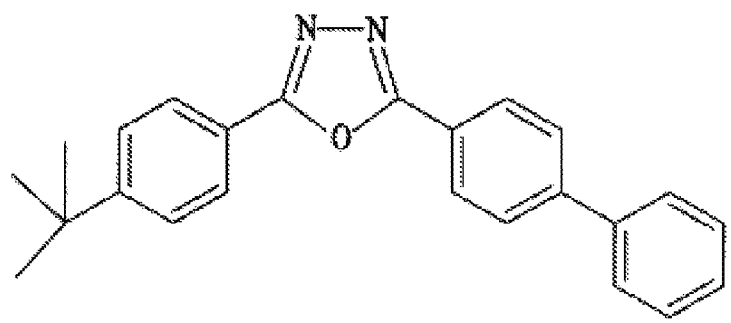
Figure 3E:
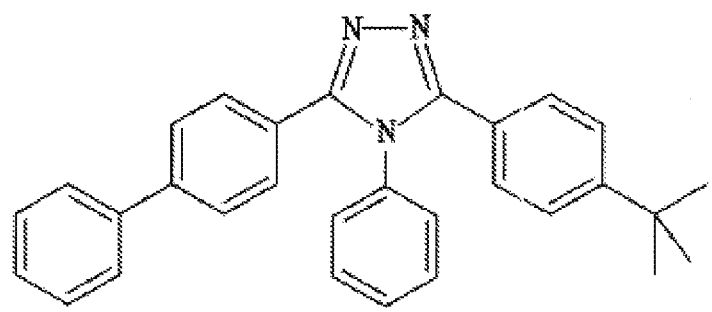
Figure 3F:
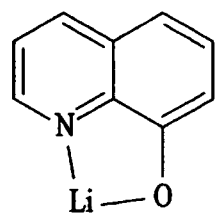
Figure 3G:
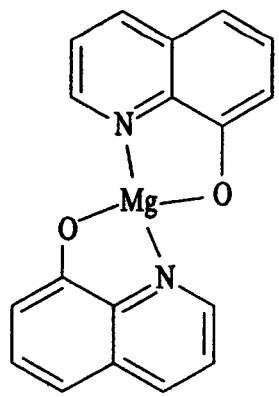
Figure 3H:
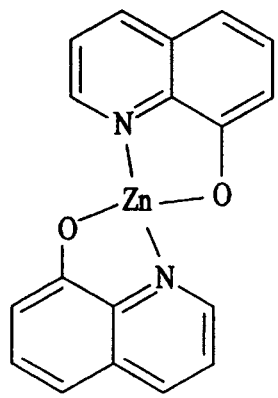

Reference will now be made in detail to the preferred embodiments of the present invention, examples of which are illustrated in the accompanying drawings. Wherever possible, the same reference numbers will be used throughout the drawings to refer to the same or like parts.

An organic electroluminescent (EL) device generates light of a certain wavelength via formation of excitons resulting from recombination between electrons and holes, injected via a cathode and an anode, in an emitting layer. A hole-transport layer is inserted between the anode and emitting layer, and an electron-transport layer is inserted between the cathode and emitting layer. This structure is highly efficient because an area for light-emitting via recombination between the electrons and holes is confined within the emitting layer.

Additionally, in order to obtain optimal luminous efficiency of the device, it is also important to adjust a balance between holes and electrons, such that carriers injected into the emitting layer are excited proximate the center of the emitting layer. For this purpose, it is possible to attain optimal efficiency by adjusting thicknesses of the respective stacked layers, taking into account transport capability of the hole-transport layer and electron-transport layer.

Conventionally, when applying a forward voltage to the organic EL device, holes from an anode, are injected into the emitting layer and electrons from a cathode are injected into the emitting layer, which results in recombination between holes and electrons in the emitting layer, thereby emitting light. An Internal Quantum Efficiency of the organic EL device is expressed by the ratio of the number of photons generated inside the device to the number of charges injected from the external electrode.

That is, Internal Quantum Efficiency ($\eta$int) is expressed by the following equation:

$$\eta int = \gamma \eta r \eta f \qquad (Eqn.\ 1)$$

wherein $\gamma$ is a factor related to a balance between electron and hole injection, $\eta r$ is a generation efficiency of singlet excitons by electron-hole recombination, and $\eta f$ is an emission quantum efficiency of singlet excitons.

When recombination between electrons and holes, each having a spin S=1/2, forms excitons in the emitting layer, there occurs a triplet state having S=1 in which two spins are symmetrically arranged and a singlet state having S=0 in which two spins are anti-symmetrically arranged, in a ratio of 3:1. A ground state of most molecules is a spin singlet state.

As such, according to selection rules, singlet excitons are allowed for radiative transition to the ground state, which is called fluorescence. Radiative transition of triplet excitons, emitting light, into a singlet-ground state is preferably prohibited. Triplet excitons may also undergo transition through light emission by perturbation such as spin-orbit coupling, which is called phosphorescence.

In phosphorescent or fluorescent organic EL devices, the balance between electron and hole injection is preferably maintained in order to obtain maximum efficiency thereof. This balance factor, $\gamma$, is referred to as a charge balance factor.

In most conventional organic EL devices, holes are injected into the emitting layer in excessive numbers compared to the number of electrons. Such injection of excessive numbers of holes leads to a decrease in efficiency of the device. When holes injected into the emitting layer are blocked to prevent such phenomena, this causes a rise in voltage on the corresponding I-V curve in most cases. Thus, an electron-transport layer which is capable of maximizing injection of electrons into the emitting layer and is capable of appropriately blocking holes injected into the emitting layer is needed.

An organic EL device in accordance with an embodiment the invention primarily comprises a substrate, a first electrode formed on the substrate, an emitting layer formed on the first electrode, a second electrode formed on the emitting layer, and an electron-transport layer formed on at least one region, i.e., between the first electrode and emitting layer and between the second electrode and emitting layer. Any one of the first electrode and second electrode may be an anode or cathode formed of a transparent material.

The electron-transport layer may include a first layer and a second layer, and the first and second layers may each include a mixture of at least two materials selected from an organic compound, a metal compound and an inorganic compound, and a composition of the first layer may be independent of a composition of the second layer.

That is, the first layer or the second layer of the electron-transport layer, or both, may include a mixture of an organic compound and one or more other organic compounds, or may be composed a mixture of a metal or inorganic compound and one or more other metal or inorganic compounds, or may include a mixture of one or more organic compounds and one or more metal or inorganic compounds.

Preferably, the first layer or second layer of the electron-transport layer has a thickness of about 0.1 to 200 nm.

The first layer or the second layer of the electron-transport layer, or both, may include a mixture of a first material and a second material, wherein a composition ratio of the first material (X) to the second material (Y) may be in the range of between approximately 1-100:1 and 1:1-100. Additionally, the first layer or the second layer of the electron-transport layer, or both, may include a mixture of a first material and plural materials, wherein a composition ratio of the first material (X) to the plural materials (Z) may be in the range of between approximately 1-100:1 and 1:1-100.

The first layer of the electron-transport layer may be positioned adjacent to the emitting layer, and may include at least one material having hole-blocking properties and at least one material having electron-transporting properties. The second layer of the electron-transport layer may be positioned adjacent to the first or second electrode, and may include at least one material having electron-transporting properties and at least one material having electron-injection-facilitating properties or electron-transport-facilitating properties.

The material having hole-blocking properties preferably has an oxidation potential greater than approximately 0.4V, and an absolute value of the Highest Occupied Molecular Orbital (HOMO) greater than approximately 5.2 eV. Generally, since the absolute value of the HOMO is about 5.2 eV for a green dopant, about 5 eV for a red dopant, and more than 5.1 eV for a blue dopant, a material having the absolute value of the HOMO of more than 5.2 eV preferably is utilized as the hole-blocking material and serves to block holes and excitons formed in the emitting layer.

The hole-blocking material may be a metal complex containing a substituted or unsubstituted 8-hydroxyquinoline, and the metal may be selected from metals such as, for example, aluminum (Al), zinc (Zn), magnesium (Mg) and lithium (Li). Alternatively, the hole-blocking material may be a substituted or unsubstituted 1,10-phenanthroline derivative, or may be a substituted or unsubstituted carbazole derivative.

The hole-blocking material, as shown in FIGS. 1a through 1e, may be selected from materials such as, for example, Balq (aluminum(III) bis(2-methyl-8-quinolinato) 4-phenylphenolate), BCP (2,9-dimethyl-4,7-diphenyl-1,10-phenanthroline), CBP [4,4'-N,N'-dicarbazole-1,1'-biphenyl], CF—X and CF—Y. Other materials may also be appropriate.

Preferably, the material having electron-transporting properties has a mobility of more than approximately $1.0 \times 10^{-6}$ cm$^2$/Vs. Other levels of mobility may also be appropriate, based on the material selected.

The material having electron-transporting properties, as shown in FIGS. 2a through 2h, may be selected from materials such as, for example, a substituted or unsubstituted aluminum (Al) complex, a substituted or unsubstituted beryllium (Be) complex, a substituted or unsubstituted zinc (Zn) complex, a substituted or unsubstituted oxidiazole derivative, a substituted or unsubstituted triazole derivative, a substituted or unsubstituted thiophene derivative, a substituted or unsubstituted pyrrole derivative, a substituted or unsubstituted silacyclopentadiene derivative, a substituted or unsubstituted anthracene derivative, a substituted or unsubstituted pyrene derivative and a substituted or unsubstituted perylene derivative. Other materials may also be appropriate.

Alternatively, the material having electron-transporting properties, as shown in FIGS. 3a through 3h, may be selected from materials such as, for example, Alq$_3$ [Tris-(8-hydroxyquinolinato)-aluminum], BeBq$_2$ [Bis(10-hydroxybenzo[h]quinolinato)beryllium], Zn(oxz)$_2$ [Bis(2-(2-hydroxyphenyl)-benz-1,3-oxadiazolato)zinc], PBD [2-(4-biphenylyl)-5-(4-tert-butyl-phenyl)-1,3,4-oxadiazole], TAZ [3-(4-biphenylyl)-4-phenyl-5-tert-butylphenyl-1,2,4-triazole], Liq [8-quinolinolato lithium], Mgq$_2$ [Bis(8-quinolinolato) magnesium] and Znq$_2$ [Bis(8-quinolinolato)zinc]. Other materials may also be appropriate.

The material having electron-injection-facilitating properties or electron-transport-facilitating properties may be an inorganic compound or a metal.

Such an inorganic compound may be selected from compounds such as, for example, alkaline metal compounds, alkaline earth metal compounds, earth metal compounds and lanthanide compounds. More specifically, the inorganic compound may be selected from halide compounds such as, for example, LiF, NaF, KF, RbF, CsF, FrF, MgF$_2$, CaF$_2$, SrF$_2$, BaF$_2$, LiCl, NaCl, KCl, RbCl, CsCl and FrCl and oxides such as Li$_2$O, Li$_2$O$_2$, Na$_2$O, K$_2$O, Rb$_2$O, Rb$_2$O$_2$, Cs$_2$O, Cs$_2$O$_2$, LiAlO$_2$, LiBO$_2$, LiTaO$_3$, LiNbO$_3$, LiWO$_4$, Li$_2$CO, NaWO$_4$, KAlO$_2$, K$_2$SiO$_3$, B$_2$O$_5$, Al$_2$O$_3$ and SiO$_2$. Other compounds may also be appropriate.

The metal may be selected from metals such as, for example, alkaline metals, alkaline earth metals, earth metals, rare earth metals and alloys thereof More specifically, the metal may be selected from Li, Na, K, Cs, Be, Mg, Ca, Sr, Ba, Y, La, Ce, Sm, Gd, Eb, Yb, an Al:Li alloy, a Mg:Sr alloy and an In:Li alloy. Other metals may also be appropriate.

If the second layer of the electron-transport layer, which may be positioned adjacent to the first electrode or second electrode, includes at least one organic compound or at least one organic metal compound, the organic compound or organic metal compound may be a compound such as, for example, a phthalocyanine derivative and a metallophthalocyanine derivative, wherein a metal component thereof is a metal such as, for example, Co, AlCl, Cu, Li$_2$, Fe, Pb, Mg, Na$_2$, Sn, Zn, Ni, Mn, VO, Ag$_2$, MnCl, SiCl$_2$ and SnCl$_2$. Alternatively, the organic compound or organic metal compound may be a porphyrin derivative and a metalloporphyrin derivative, wherein a metal component is any one of Co, AlCl, Cu, Li$_2$, Fe, Pb, Mg, Na$_2$, Sn, Zn, Ni, Mn, VO, Ag$_2$, MnCl, SiCl$_2$ and SnCl$_2$. Other materials for forming these compounds may also be appropriate.

Additionally, the electron-transport layer may include a third layer formed between the first layer and second layer of the electron-transport layer. The third layer of the electron-transport layer may include one or more sublayers, and may be a mixture of at least two materials selected from an organic compound, a metal compound and an inorganic compound, or may be formed of a single material selected from an organic compound, a metal compound and an inorganic compound. The third layer of the electron-transport layer may be formed of the same or different materials as in the first and second layers of the electron-transport layer.

In this manner, an electron-transport layer made of a novel material can be applied to various structures of organic EL devices in order to improve efficiency and service life of the devices.

FIGS. 4 to 7 are sectional views of organic EL devices in accordance with the first to fourth embodiments of the present invention.

Figure 4:
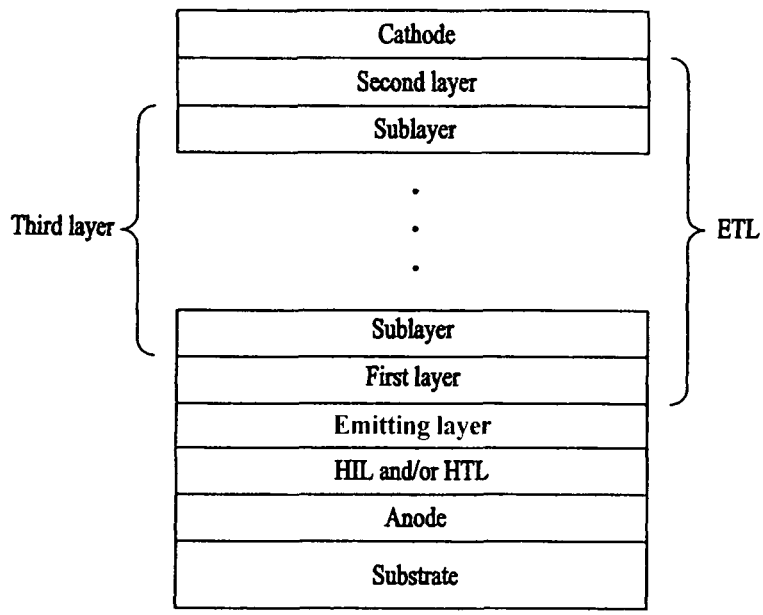
FIGS. 4 to 7 are sectional views of organic EL devices in accordance with embodiments of the present invention.
Figure 5:
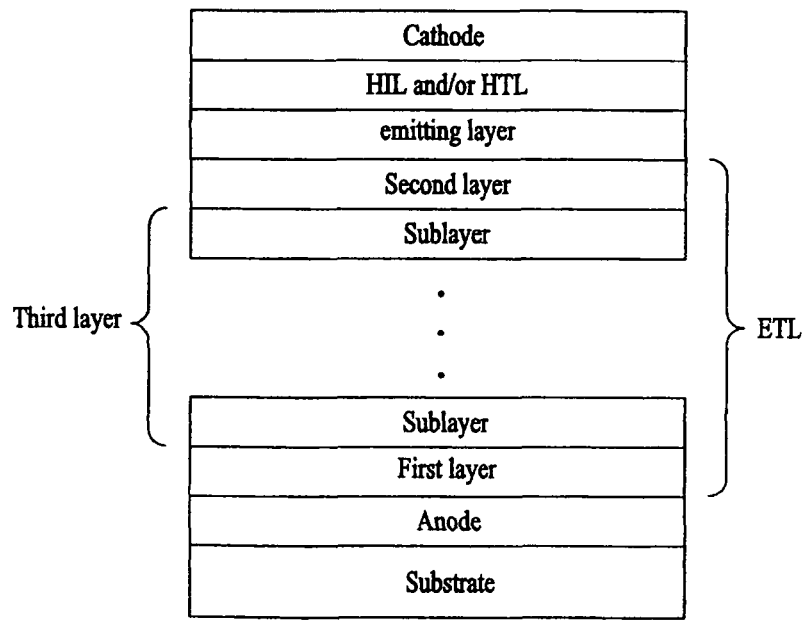

As shown in FIGS. 4 and 5, the electron-transport layer includes a first layer adjacent to an emitting layer, a second layer adjacent to one of the electrodes (in this example, the cathode), and a third layer including one or more sublayers formed between the first layer and second layer. In FIG. 5, the electron-transport layer includes a first layer adjacent to one of the electrodes (in this example, the anode), a second layer adjacent to an emitting layer, and a third layer including one or more sublayers formed between the first and second layers. In either of these configurations, the third layer may be omitted.

Figure 6:
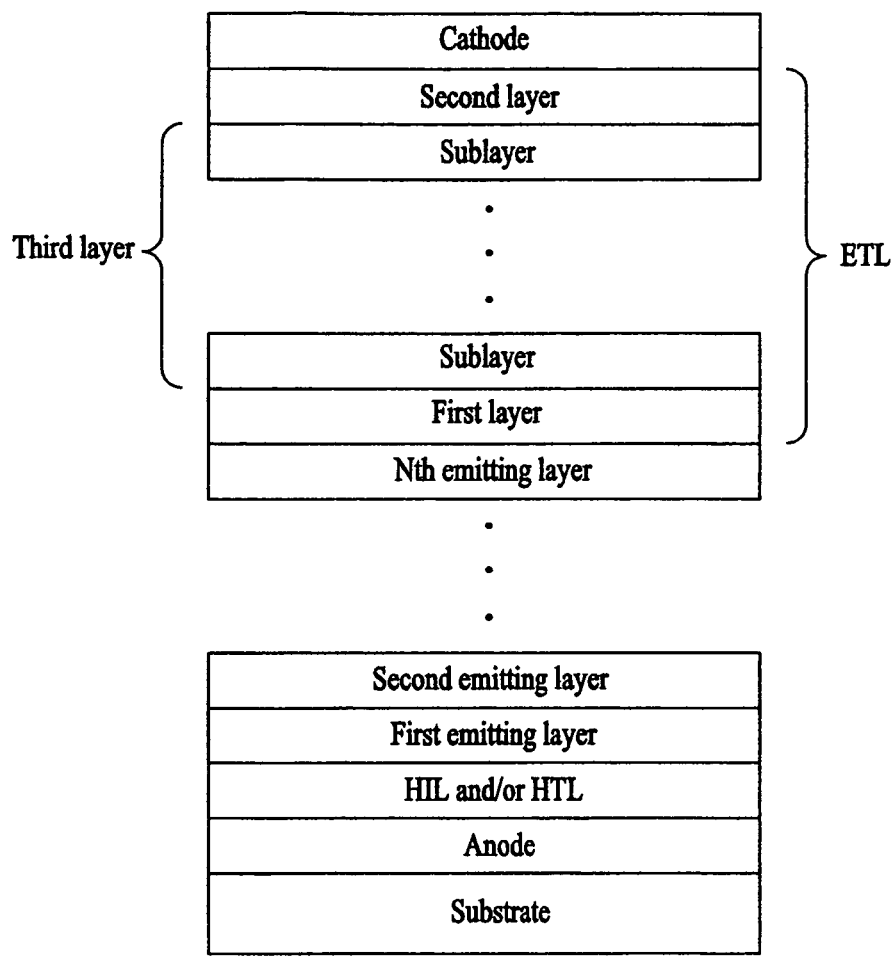

At least one layer of a hole-injection layer and a hole-transport layer may be formed between the anode and emitting layer and an electron-injection layer may be formed between the cathode and electron-transport layer. Additionally, the emitting layer may include at least one phosphorescent material. As shown in FIG. 6, the emitting layer may also include a plurality of layers. As such, in accordance with the present invention, it is possible to fabricate various structures of organic EL devices which have improved efficiency and service life.

Figure 7:
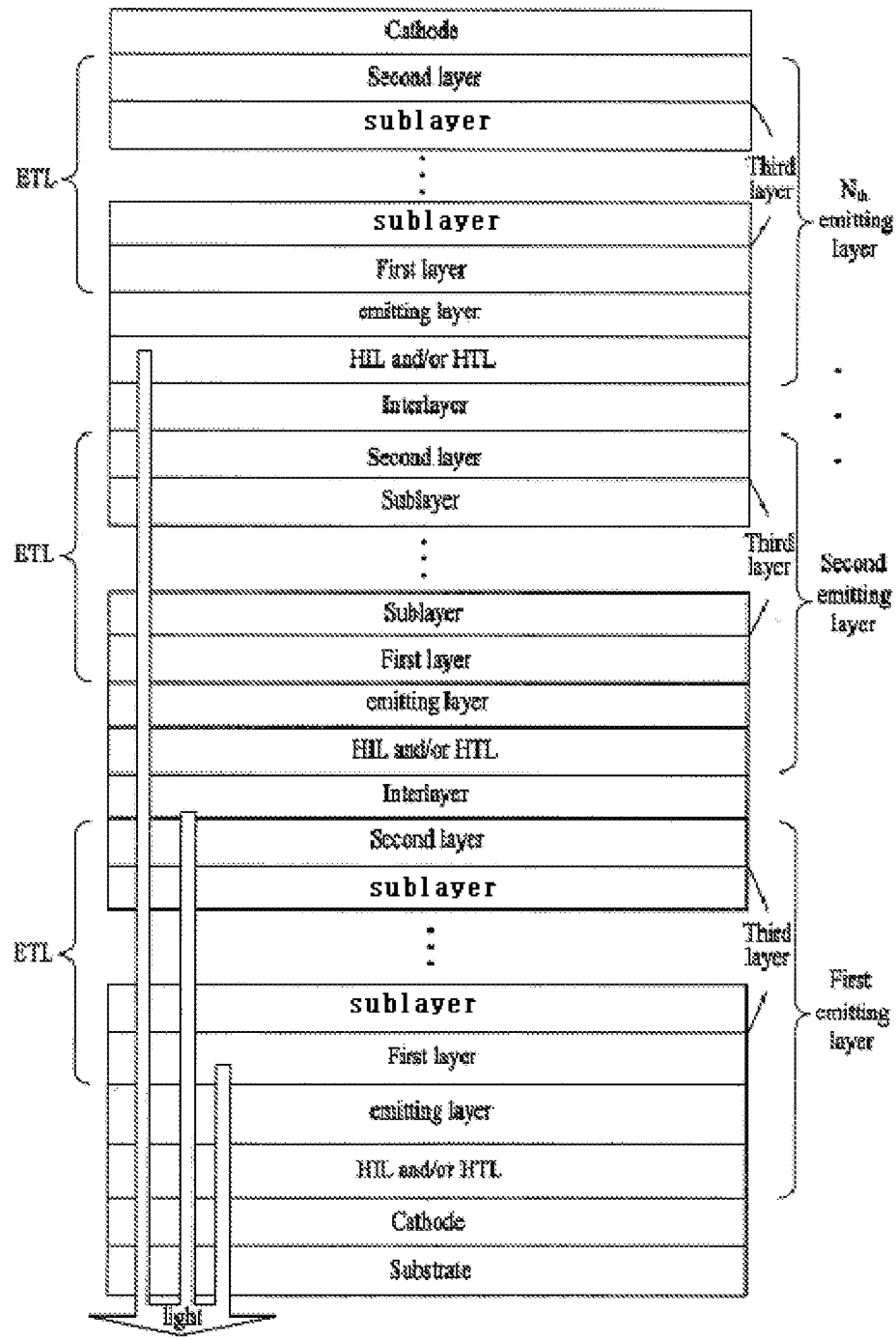

A multi-structure fabrication of an organic EL device in accordance with an embodiment of the invention is shown in FIG. 7. In this configuration, the organic EL device has a multitude of light-emitting units, each including an emitting layer and an electron-transport layer between an anode and a cathode, with adjacent emitting units separated by interlayers.

Each light-emitting unit includes an electron-transport layer including a first layer which may be a mixture of at least one material having hole-blocking properties and at least one material having electron-transporting properties, and a second layer which may be a mixture of at least one material having electron-transporting properties and at least one material having electron-injection-facilitating properties or electron-transport-facilitating properties.

Each of the light-emitting units may also include a third layer which has one or more sublayers provided between the first layer and second layer of the electron-transport layer. The respective sublayers of the third layer may include a mixture of at least two materials selected from an organic compound, a metal compound and an inorganic compound, or may be formed of a single material selected from an organic compound, a metal compound and an inorganic compound. The light-emitting units may have the same stack structures, or may have different stack structures.

A fabrication process for an organic EL device in accordance with the present invention will now be described.

First, a first electrode is formed on a substrate, and an emitting layer containing at least one phosphorescent material is formed on the first electrode. Next, an electron-transport layer including a first layer which may be a mixture of at least one material having hole-blocking properties and at least one material having electron-transporting properties and a second layer which may be a mixture of at least one material having electron-transporting properties and at least one material having electron-injection-facilitating properties or electron-transport-facilitating properties is formed over substantially the entire emitting layer.

If necessary, the electron-transport layer may further include a third layer which may include one or more sublayers formed of a mixture of at least two materials selected from an organic compound, a metal compound, and an inorganic compound or formed of a single material selected from an organic compound, a metal compound and an inorganic compound, on the first layer.

Then, a second electrode is preferably formed on the electron-transport layer.

As such, in a device in which the emitting layer includes a phosphorescent material (a phosphorescent organic EL device), the electron-transport layer (ETL) performs a hole-blocking function, and therefore a separate hole-blocking layer is not needed. Therefore, the present invention provides a simplified manufacturing process through the formation of an electron-transport layer, without the need for a separate hole-blocking layer.

More particularly, upon fabricating a full-color organic electroluminescent device, where at least one of a red-emitting layer, a green-emitting layer and a blue-emitting layer is a fluorescent emitting layer and at least one of the remaining layers is a phosphorescent layer (a phosphorescent-fluorescent hybrid organic EL device), the present invention enables provision of a simplified manufacturing process by uniformly forming an electron-transport layer which performs a hole-blocking function throughout substantially the entire phosphorescent and fluorescent emitting layers, without formation of a separate hole-blocking layer on the phosphorescent emitting layers.

In order to examine characteristics of the organic EL device in accordance with the present invention thus fabricated, characteristics of IVL were compared between $Alq_3$, which is used as a conventional material for an electron-transport layer, and Balq [aluminum(III) bis(2-methyl-8-quinolinato) 4-phenylphenolate], which is used as a hole-blocking material.

EXAMPLES

The present invention will be described in more detail with reference to the following examples. These examples are provided for illustrative purposes only, and should not be construed as limiting the scope and spirit of the present invention.

Example 1

1) An anode made of Indium Tin Oxide (ITO) is formed on a transparent substrate, and a hole-injection layer (HIL) made of copper phthalocyanine (CuPc) is applied on the anode to a thickness of about 25 nm.

2) A hole-transport layer (HTL) is formed by applying 4,4'bis[N-(1-naphthyl)-N-phenyl-amino]biphenyl (NPD) on the HIL to a thickness of about 35 nm.

3) In order to prepare a green-emitting layer, 8-hydroxyquinoline aluminum ($Alq_3$), doped with about 1% $CO_6$, is applied on the HTL to a thickness of about 25 nm.

4) Alq$_3$ (Device A) or Balq (Device B) is applied on the emitting layer to a thickness of about 35 nm to form an electron-transport layer (ETL).

5) LiF is applied on the ETL to a thickness of about 0.5 nm to form an electron-injection layer (EIL).

6) Aluminum (Al) is applied on the EIL to a thickness of about 150 nm to form a cathode.

Figure 8:
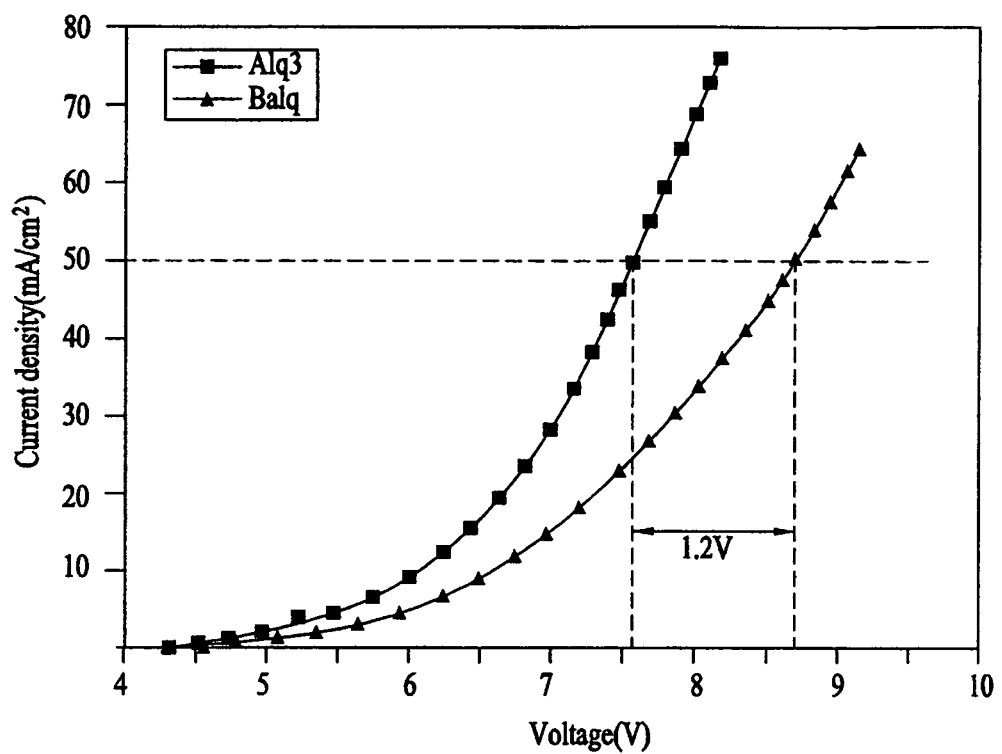
FIGS. 8 and 9 are graphs comparing characteristics of IVL with respect to materials used in an electron-transport layer.
Figure 9:
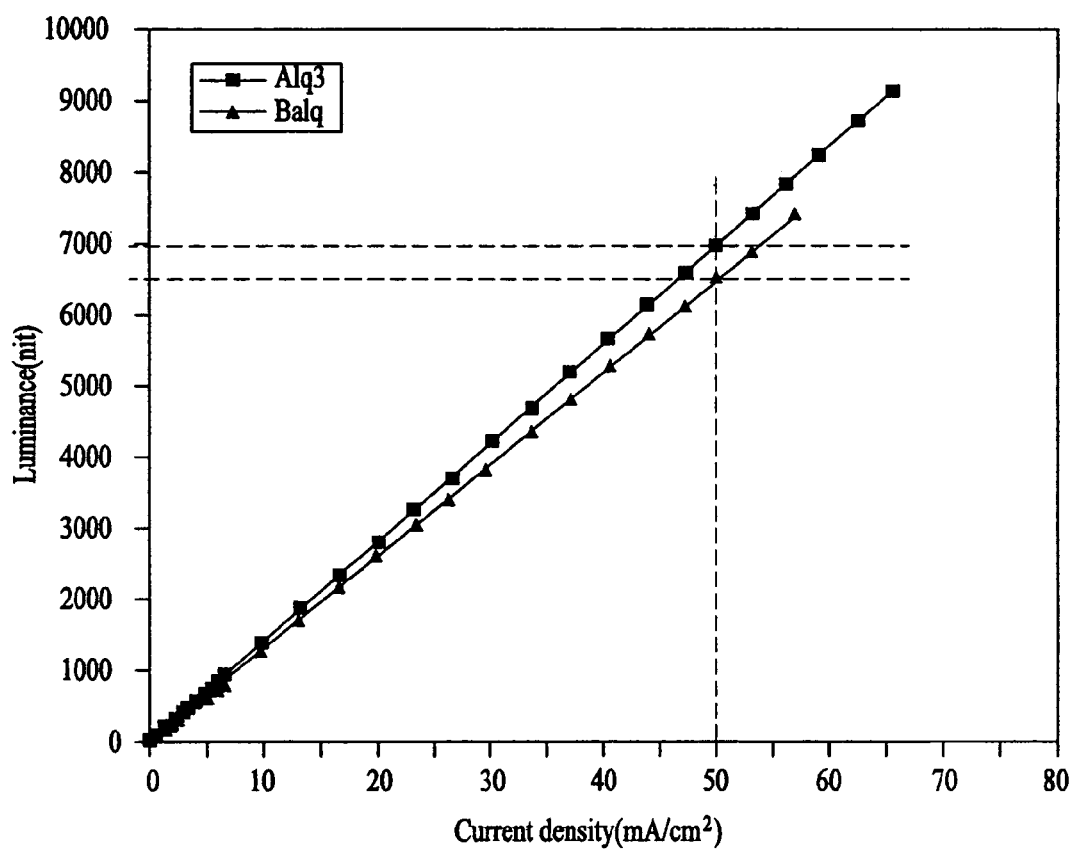

A comparison of IVL characteristics between the Device A and Device B as fabricated in this manner is shown in FIGS. 8 and 9. In Device A, where Alq$_3$ is used as the electron-transport layer, holes serve as majority carriers. Therefore, a large number of injected holes remain in the emitting layer. Balq may be used to block such holes, but exhibits lower electron mobility than when Alq$_3$ is used.

As shown in FIGS. 8 and 9, it can be seen that Device B, using Balq as the electron-transport layer, exhibits lower voltage performance of about 1.2 V than Device A using Alq$_3$ as the electron-transport layer, on the I-V curve. Thus, even though a material having hole-blocking properties and electron-transporting properties is required, there still remains a need for development of a material satisfying the above-mentioned two properties.

As such, the present invention has achieved improved efficiency of the organic EL device via adjustment of charge balance between holes and electrons in the emitting layer by maintaining an electron-transporting ability of the electron-transport layer while simultaneously blocking holes, through use of a mixture of a material having hole-blocking properties and a material having electron-transporting properties, as the material for the electron-transport layer.

Example 2

FIG. 10 is a sectional view of an organic EL device in accordance with an embodiment of the invention.

1) An ITO anode is formed on a transparent substrate, and a hole-injection layer (HIL) made of copper phthalocyanine (CuPc) is applied on the anode to a thickness of about 25 nm.

2) 4,4'bis[-(1-naphthyl)-N-phenyl-amino]biphenyl (NPD) is applied on the HIL to a thickness of about 35 nm to form a hole-transport layer.

3) In order to prepare a green-emitting layer, 8-hydroxyquinoline aluminum (Alq$_3$), doped with about 1% C545T, is applied on the HTL to a thickness of about 25 nm.

4) An electron-transport layer (ETL) is formed on the emitting layer by applying Alq$_3$ having superior electron mobility and Balq having superior hole blocking ability to a thickness of about 35 nm on the emitting layer, in a 3:7 volume % ratio of Balq and Alq$_3$ Device C), or in a 5:5 volume % ratio of Balq and Alq$_3$ Device D), or in a 7:3 volume % ratio of Balq and Alq$_3$ (Device E).

5) Next, an electron-injection layer (EIL) is formed by applying LiF on the ETL to a thickness of about 0.5 nm.

6) Next, a cathode is formed by applying aluminum (Al) to a thickness of about 150 nm on the EIL.

Figure 11:
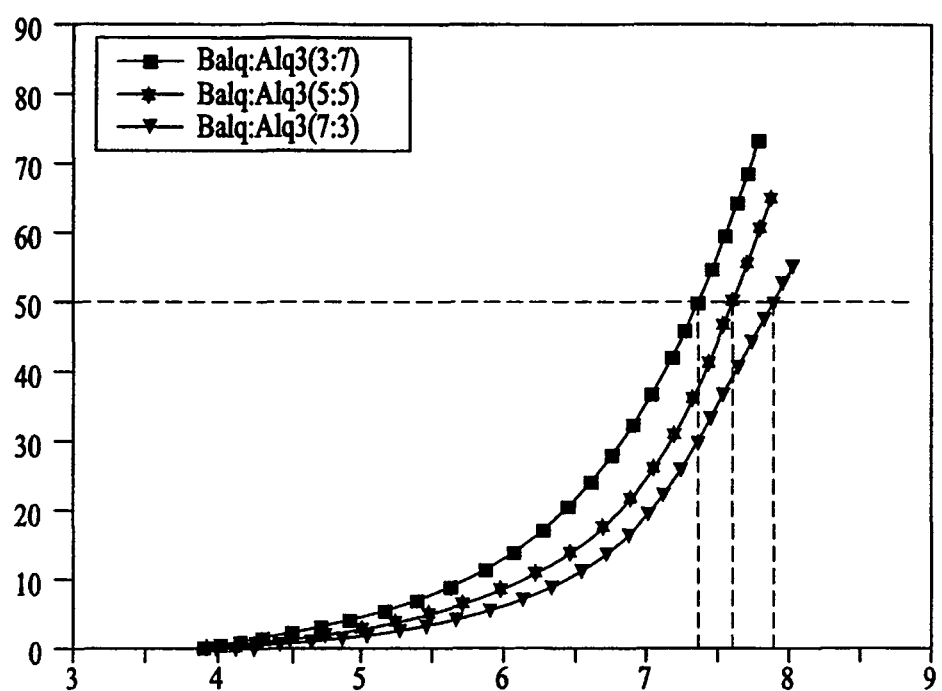
FIGS. 11 and 12 are graphs comparing IVL characteristics with respect to a composition ratio of a Balq:Alq$_3$ electron-transport layer.
Figure 12:
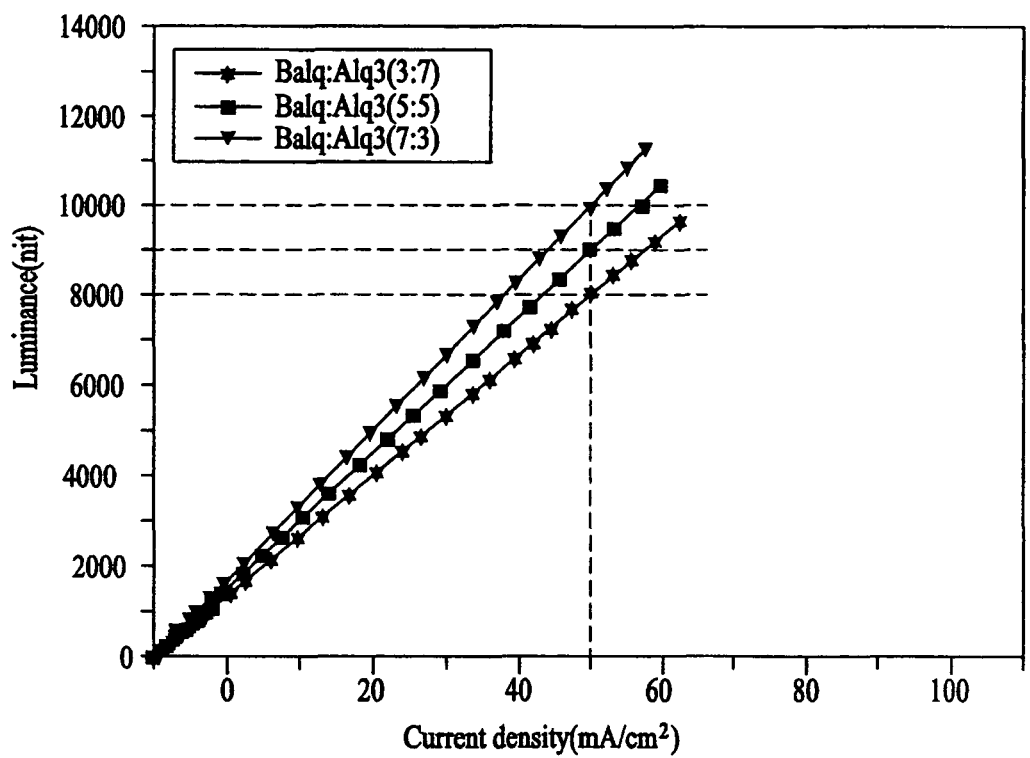

A comparison of IVL characteristics between the thus-fabricated Devices C, D and E are shown in FIGS. 11 and 12. As can be seen from FIGS. 11 and 12, Device C (Balq:Alq$_3$=3:7) exhibited poor I-L characteristics, but exhibited I-V characteristics similar to Device A using Alq$_3$ alone. Device E (Balq:Alq$_3$=7:3) exhibited superior I-L characteristics while exhibiting the lowest I-V characteristics among three devices, but it can be seen that Device E has an improved voltage as compared to Device B using Balq alone, which was exemplified in Example 1.

Thus, it is possible to increase efficiency of an organic EL device by confining holes, which were injected into the emitting layer through the hole-transport layer from the anode (ITO), within the emitting layer, via suitable incorporation of an appropriate material having hole-blocking properties into the electron-transport layer of the organic EL device.

Table 1 below shows comparison of characteristics between the respective devices at a current density of 50 mA/cm$^2$.

TABLE 1

| | ETL | Voltage (V) | Luminance (nit) | cd/A | lm/W | Efficiency (%) |
|---|---|---|---|---|---|---|
| Device A | Alq$_3$ | 7.5 | 6712 | 13.4 | 5.6 | Ref |
| Device B | Balq | 8.7 | 6454 | 12.9 | 4.7 | 83 |
| Device C | Balq:Alq$_3$ = 3:7 | 7.38 | 8155 | 16.3 | 6.9 | 123 |
| Device D | Balq:Alq$_3$ = 5:5 | 7.59 | 9118 | 18.2 | 7.5 | 134 |
| Device E | Balq:Alq$_3$ = 7:3 | 7.87 | 10080 | 20.2 | 8.0 | 143 |

Example 3

Hereinafter, another example of an electron-transport layer which may be utilized in the present invention will be described with respect to FIG. 13.

The device shown in FIG. 13 was fabricated using BeBq$_2$ as an electron-transporting material and Balq as a hole-blocking material. The electron-transporting capabilities of BeBq$_2$ is superior to that of Alq$_3$ as used previously, and thus performance of the device could be further enhanced.

1) First, an ITO anode is formed on a transparent substrate, and a hole-injection layer (HIL) is formed by applying copper phthalocyanine (CuPc) to a thickness of about 25 nm on the anode.

2) A hole-transport layer (HTL) is formed by applying 4,4'bis[N-(1-naphthyl)-N-phenyl-amino]biphenyl (NPD) to a thickness of about 35 nm on the HIL.

3) In order to prepare a green-emitting layer, 8-hydroxyquinoline aluminum (Alq$_3$), doped with about 1% C545T, is applied on the HTL to a thickness of about 25 nm.

4) Next, an electron-transport layer (ETL) is formed by applying BeBq$_2$ having superior electron mobility and Balq having superior hole-blocking ability on the emitting layer to a thickness of about 35 nm, in a 5:5 volume % ratio of Balq and BeBq$_2$ (Device F).

5) Next, an electron-injection layer (EIL) is formed by applying LiF on the ETL to a thickness of about 0.5 nm.

6) Next, a cathode is formed by applying aluminum (Al) on the EIL to a thickness of about 150 nm.

Table 2 below shows comparison of characteristics between the respective devices at a current density of 50 mA/cm$^2$.

TABLE 2

| | ETL | Voltage (V) | Luminance (nit) | cd/A | lm/W | Efficiency (%) |
|---|---|---|---|---|---|---|
| Device A | Alq$_3$ | 7.5 | 6712 | 13.4 | 5.6 | Ref |
| Device D | Balq:Alq$_3$ = 5:5 | 7.59 | 9118 | 18.2 | 7.5 | 134 |
| Device F | Balq:BeBq$_2$ = 5:5 | 6.7 | 10532 | 21.1 | 9.9 | 176 |

As can be seen from Table 2, Device F, using a mixture of Balq and BeBq$_2$ as the ETL, exhibited a 0.8V improvement in I-V characteristics and about 3820 nit improvement in I-L characteristics, as compared to Device A. As a result, power efficiency of Device F was improved by 176% as compared to a reference value of Device A.

Figure 14:
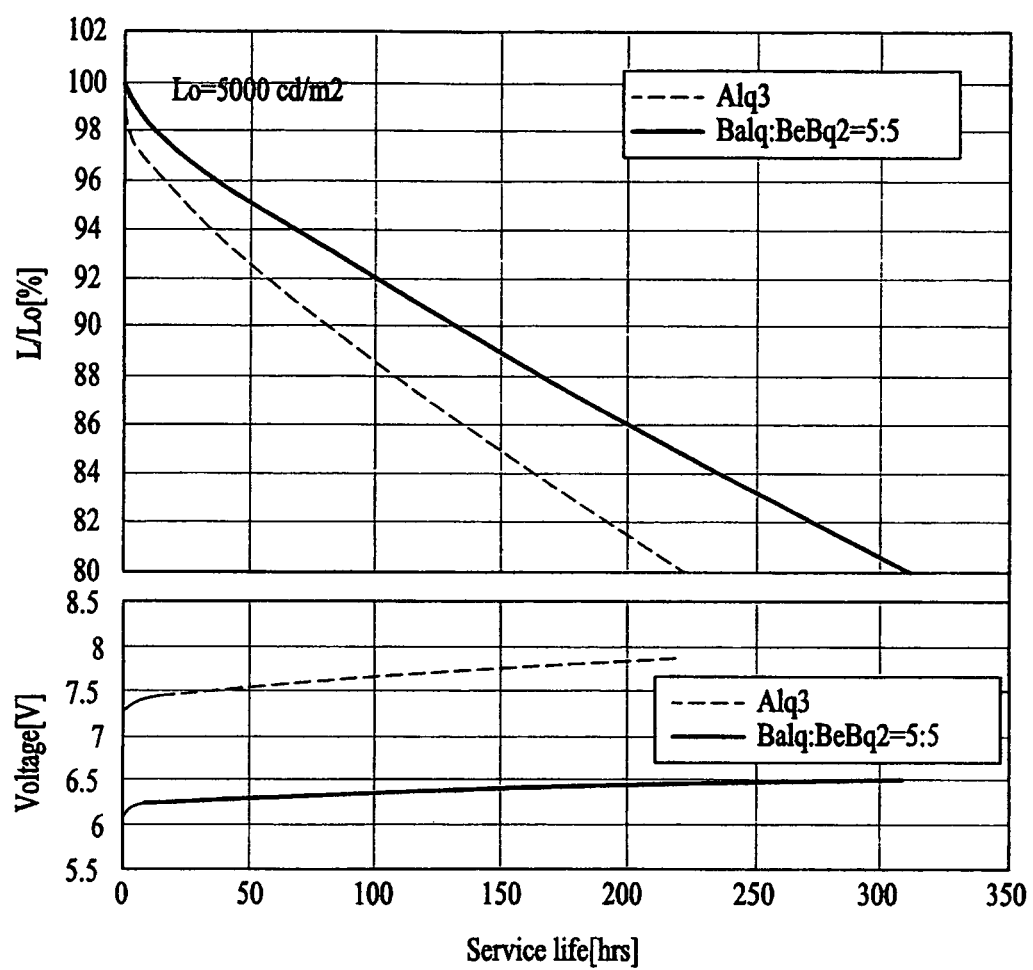
FIG. 14 is a graph comparing service lives of devices with respect to materials used in an electron-transport layer.

FIG. 14 is a comparison of a service life between Device A and Device F. As shown in FIG. 14, the service life of Device F at the same luminance of 5,000 nit is significantly improved as compared to Device A.

Hereinafter, an example will be discussed in which the electron-transport layer utilized in the present invention is applied to a phosphorescent organic EL device.

Generally, formation of excitons via recombination between electrons and holes, each having a spin S=1/2, in the emitting layer, results in occurrence of a triplet state having S=1 in which two spins are symmetrically arranged and a singlet state having S=0 in which two spins are anti-symmetrically arranged, in a ratio of 3:1. A ground state of most molecules is a spin singlet state.

Therefore, according to selection rules, singlet excitons may be allowed for radiative transition to the ground state, which is called fluorescence. Radiative transition of triplet excitons with emission of light into a singlet ground state is preferably prohibited. Triplet excitons may also undergo transition through light emission by perturbation such as spin-orbit coupling, which is called phosphorescence.

Phosphorescent devices accomplish emission of light utilizing triplet excitons. In order to confine triplet excitons within the emitting layer such that triplet excitons formed in the emitting layer do not migrate to the cathode, the hole-blocking layer may be used next to the emitting layer. That is, the phosphorescent organic EL device may employ two layers, the hole-blocking layer and the electron-transport layer, capable of confining triplet excitons, next to the emitting layer. However, if an electron-transport layer capable of performing both functions as mentioned above is employed, there is no need for an additional hole-blocking layer.

Example 4

Figure 15:
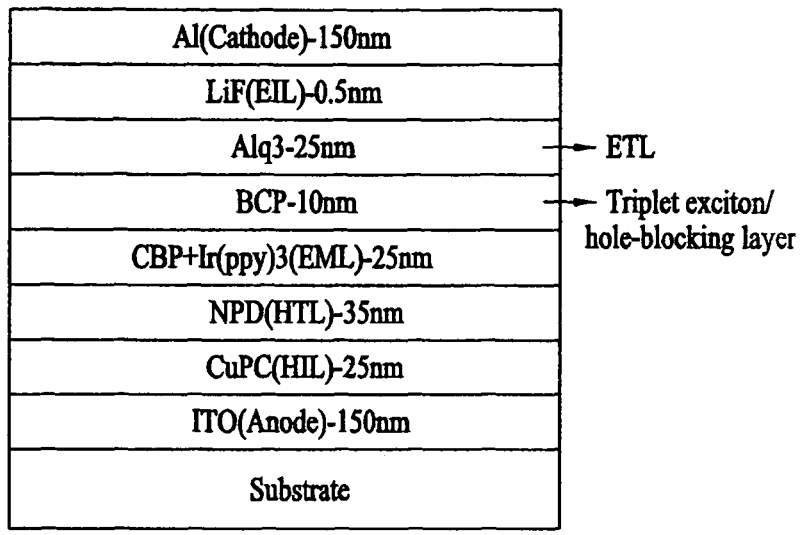
FIGS. 15 and 16 are sectional views of organic EL devices in accordance with embodiments of the present invention.
Figure 16:
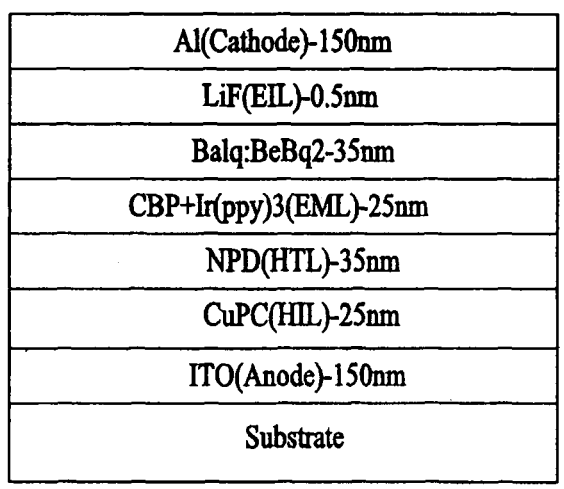

FIGS. 15 and 16 are sectional views of organic EL devices in accordance with embodiments of the invention. Fabrication of the device shown in FIG. 15 will first be discussed.

1) First, an ITO anode is formed on a transparent substrate, and a hole-injection layer (HIL) made of copper phthalocyanine (CuPc) is applied on the anode to a thickness of about 25 nm.

2) A hole-transport layer (HTL) is formed by applying 4,4'bis[N-(1-naphthyl)-N-phenyl-amino]biphenyl (NPD) on the HIL to a thickness of about 35 nm.

3) In order to prepare a phosphorescent green-emitting layer, 4,4'-N,N'-dicarbazole-1,1'-biphenyl (CBP), doped with about 8% tris(2-phenylpyridine)iridium [Ir(ppy)$_3$], is applied on the HTL to a thickness of about 25 nm.

4) Next, 2,9-dimethyl-4,7-diphenyl 1,10-phenanthroline [BCP], atriplet exciton-blocking material, is applied to a thickness of about 10 nm, and Alq$_3$ is applied to a thickness of about 25 nm to form an electron-transport layer (ETL).

CBP+Ir(ppy)$_3$(8%)/BCP/Alq$_3$      Device G 25 nm 10 nm 25 nm

5) Next, BeBq$_2$, which has superior electron mobility, and Balq, which has superior hole-blocking ability, are applied to a thickness of about 35 nm, in a 5:5 volume % ratio of Balq to BeBq$_2$ to form an electron-transport layer (ETL).

CBP+Ir(ppy)$_3$(8%)/Balq:BeBq$_2$=5:5      Device H 25 nm 35 nm

6) Next, an electron-injection layer (EIL) is formed by applying LiF on the ETL to a thickness of about 0.5 nm.

7) Next, a cathode is formed by applying aluminum (Al) on the EIL to a thickness of 150 nm.

Table 3 below shows comparison of characteristics between the respective green-phosphorescent devices at a current density of 25 mA/cm$^2$.

TABLE 3

| | ETL | Voltage (V) | Luminance (nit) | cd/A | lm/W | Efficiency (%) |
|---|---|---|---|---|---|---|
| Device G | BCP/Alq$_3$ | 8 | 6857 | 27.4 | 10.8 | Ref |
| Device H | Balq:BeBq$_2$ = 5:5 | 7.8 | 6702 | 26.8 | 10.8 | 100 |

As can be seen from Table 3, the present invention using the electron-transport layer can achieve the same characteristics (1 m/W) as the conventional device using BCP/Alq$_3$. Therefore, the electron-transport layer utilized in the present invention advantageously provides a simplified manufacturing process and can achieve characteristics and efficiency comparable to the conventional device which must use a separate hole-blocking layer to achieve such results.

Fabrication of a full-color panel as shown in FIG. 16 will now be discussed.

If all of red-, green- and blue-emitting devices utilize a fluorescent or phosphorescent material, the same electron-transport layers may be employed. However, if one or two devices of red-, green- and blue-emitting devices utilize a fluorescent or phosphorescent material, the device utilizing the phosphorescent material conventionally employs a blocking layer to block triplet excitons. As such, a device utilizing phosphorescent material and a device utilizing fluorescent material exhibit differences in the composition of their respective electron-transport layers which will be deposited next to their respective emitting layer.

Electron-transport layers for the respective devices may be deposited as follows.

For example, reference will be made to the following:
Green-phosphorescent device: CBP+Ir(ppy)$_3$/BCP(10 nm)/Alq$_3$(25 nm)
Red-fluorescent device: Alq$_3$+dcjtb/Alq$_3$(35 nm)
Blue-fluorescent device: DPVBi/Alq$_3$(35 nm)

As the present invention utilizes an electron-transport layer in which a hole-blocking material is incorporated, it is possible to simplify a manufacturing process via formation of a single electron-transport layer alone, without formation of electron-transport layers having different structures according to the respective corresponding emitting devices.

For example, reference will be made to the following:
Green-phosphorescent device: CBP+Ir(ppy)$_3$/Balq:BeBq$_2$=5:5(35 nm)
Red-fluorescent device: Alq$_3$+dcjtb/Balq:BeBq$_2$=5:5(35 nm)
Blue-fluorescent device: DPVBi/Balq:BeBq$_2$=5:5(35 nm)

As such, when utilizing a common electron-transport layer, it is possible to simplify a manufacturing process and enhance efficiency of the device in phosphorescent-fluorescent hybrid devices as well.

Additionally, in the organic EL device of the present invention, it can be seen that since minor carriers among carriers injected into the emitting layer are electrons, improving injection ability of minor carriers enhances efficiency of the device, as shown in the I-V curve and I-L curve.

Example 5

1) First, an ITO anode is formed on a transparent substrate, and a hole-injection layer (HIL) is formed by applying copper phthalocyanine (CuPc) on the anode to a thickness of about 25 nm.

2) A hole-transport layer (HTL) is formed by applying 4,4'bis[N-(1-naphthyl)-N-phenyl-amino]biphenyl (NPD) on the HIL to a thickness of about 35 nm.

3) In order to prepare a green-emitting layer, 8-hydroxyquinoline aluminum ($Alq_3$), doped with about 1% C545T, is applied on the HTL to a thickness of about 25 nm.

4) Next, a first layer of an electron-transport layer (ETL) is formed by applying $Alq_3$ on the emitting layer to a thickness of about 25 nm.

5) Next, a second layer of an electron-transport layer is formed by applying $BeBq_2$: LiF in a 1:1 volume % ratio on the first layer to a thickness of about 35 nm (Device I). In this example, this second layer of the electron-transport layer also serves as an electron-injection layer (EIL).

6) Next, a cathode is formed by applying aluminum (Al) on the second layer of the electron-transport layer to a thickness of about 150 nm.

Table 4 below shows comparison of characteristics between Device A and Device I at a current density of 50 $mA/cm^2$.

TABLE 4

|  | ETL | Voltage (V) | Luminance (nit) | cd/A | lm/W | Efficiency (%) |
|---|---|---|---|---|---|---|
| Device A | $Alq_3$ | 7.5 | 6712 | 13.4 | 5.6 | Ref |
| Device I | $Alq_3$/$BeBq_2$:LiF | 6.8 | 8050 | 16.1 | 7.9 | 140 |

Figure 17:
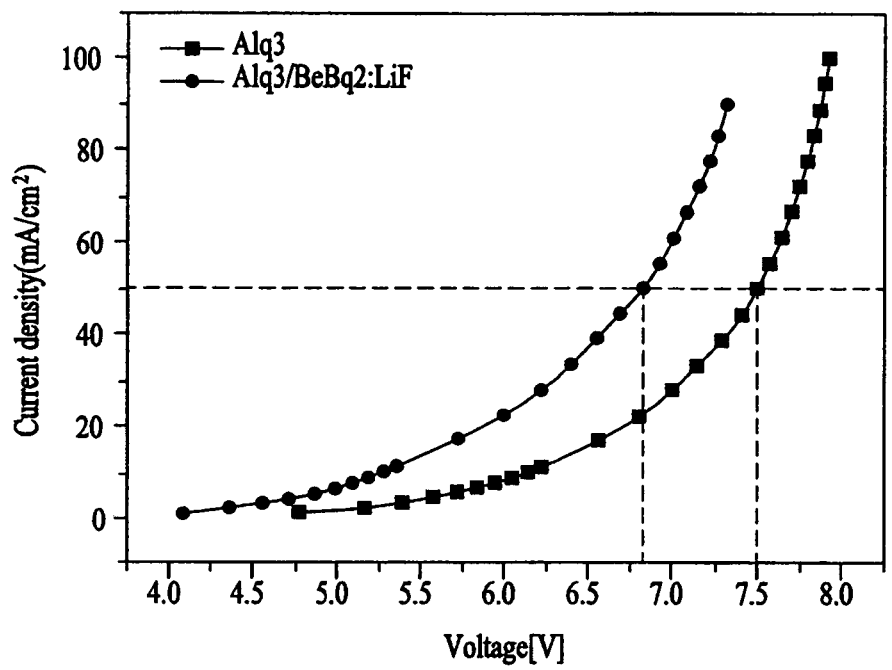
FIGS. 17 and 18 are graphs comparing IVL characteristics with respect to a Alq$_3$/BeBq$_2$:LiF electron-transport layer.
Figure 18:
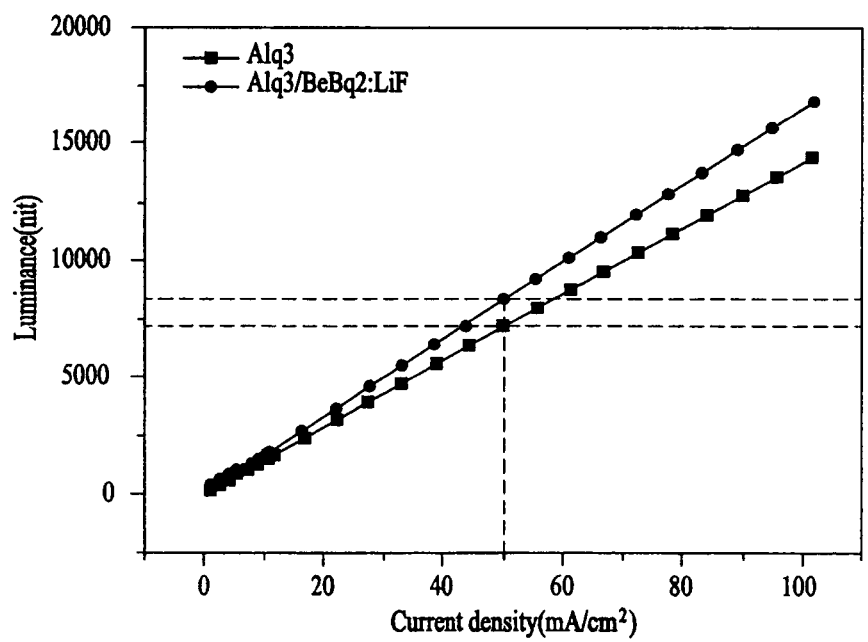
Figure 19:
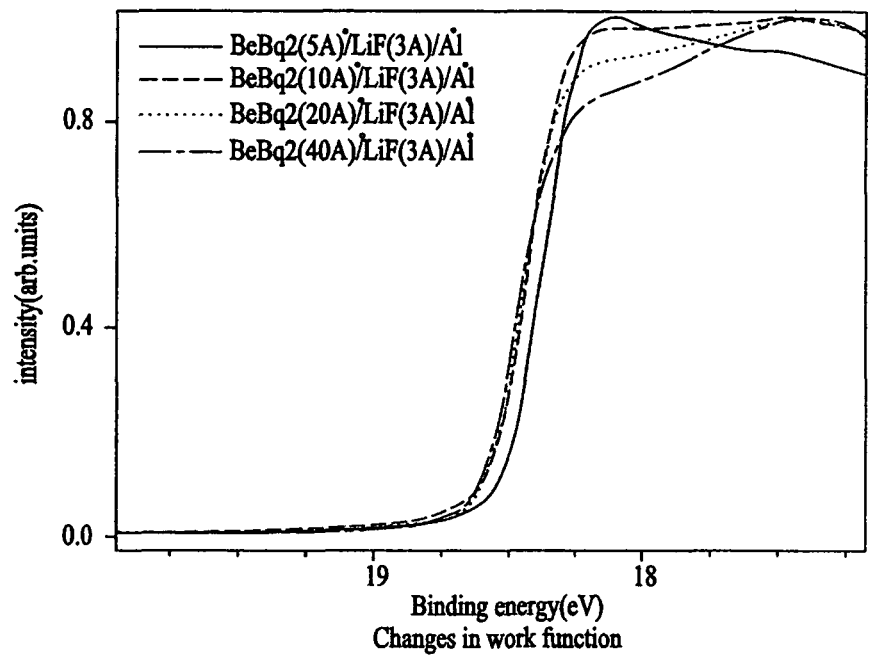
FIGS. 19 to 22 are graphs comparing characteristics of devices with respect to a composition ratio of a BeBq$_2$/LiF/Al electron-transport layer.
Figure 20:
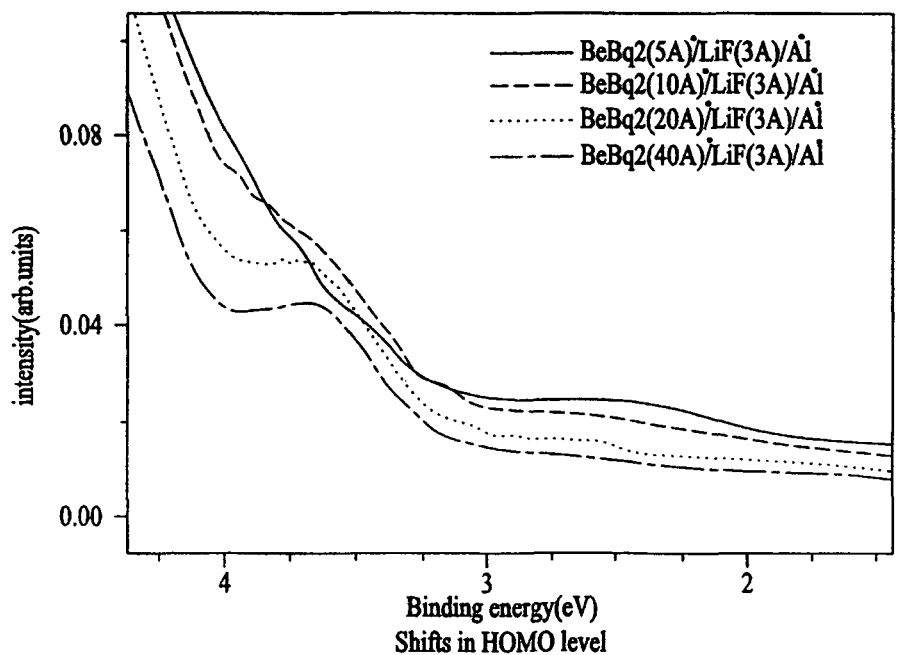
Figure 21:
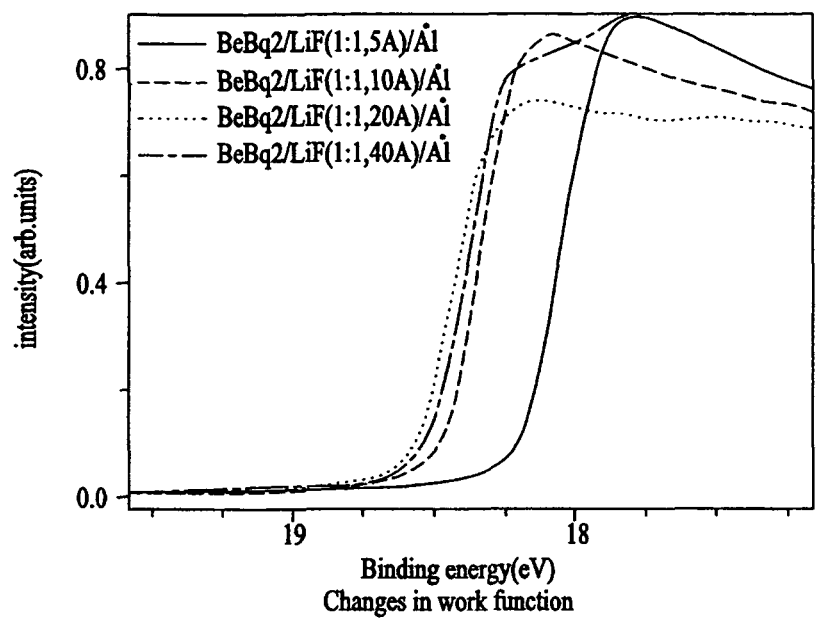
Figure 22:
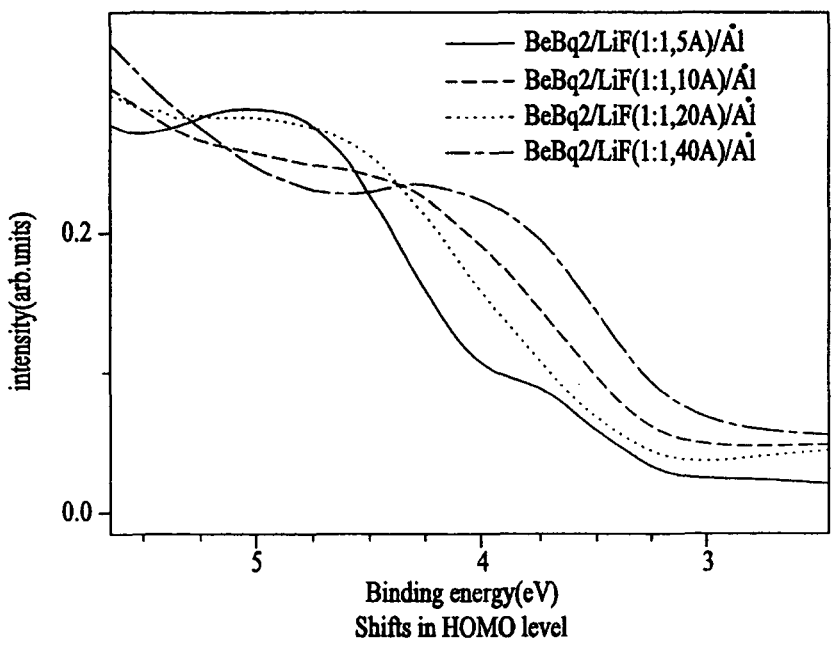
Figure 23:
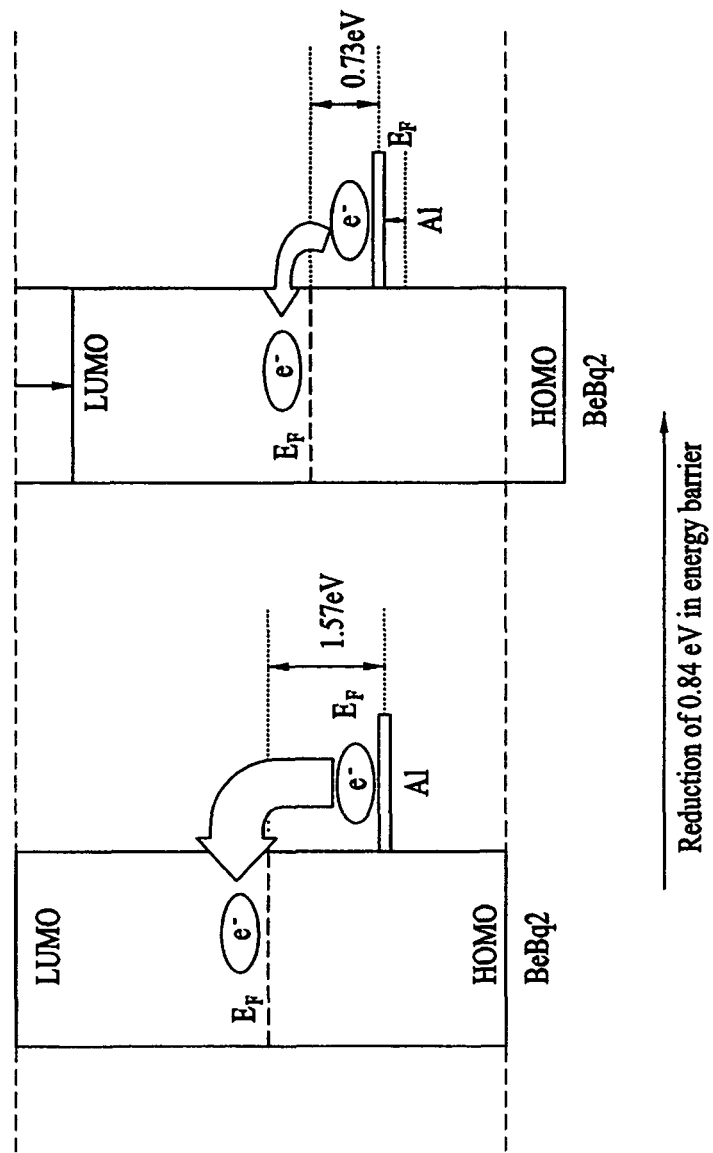
FIG. 23 is a graph showing changes in a barrier height upon electron injection of a BeBq$_2$/LiF/Al electron-transport layer.

As can be seen from Table 4 and FIGS. 17 and 18, Device I using a co-deposition of $BeBq_2$:LiF as the second layer of the electron-transport layer exhibited an improved voltage characteristics of about 1V on the I-V curve and increased efficiency of the device on the I-L curve, as compared to Device A.

As shown in FIGS. 19 through 23, the present invention facilitates electron injection by lowering a potential barrier height between the electron-transport layer and cathode, via introduction of a structure as discussed above with respect to Device I. Consequently, the present invention yields a decreased voltage and improved efficiency.

Example 6

Example 6 illustrates a case in which an electron-transport layer as discussed above with respect to Example 3 and a second layer of the electron-transport layer as discussed above with respect to Example 5 are simultaneously applied.

1) First, an ITO anode is formed on a transparent substrate, and a hole-injection layer (HIL) is formed by applying copper phthalocyanine (CuPc) on the anode to a thickness of about 25 nm.

2) A hole-transport layer (HTL) is formed by applying 4,4'bis[N-(1-naphthyl)-N-phenyl-amino]biphenyl (NPD) on the HIL to a thickness of about 35 nm.

3) In order to prepare a green-emitting layer, 8-hydroxyquinoline aluminum ($Alq_3$), doped with about 1% C545T, is applied on the HTL to a thickness of about 25 nm.

4) Next, a first layer of an electron-transport layer (ETL) is formed on the emitting layer. The first layer of the electron-transport layer is formed by co-deposition of Balq, which is a hole-blocking material (HBM), and $Alq_3$, which facilitates electron transportation to the emitting layer, to a thickness of about 25 nm, and in a 5:5 volume % ratio.

5) Next, a second layer of an electron-transport layer is formed on the first layer of the electron-transport layer. The second layer of the electron-transport layer is formed by co-deposition of $BeBq_2$, which is an electron-transport-facilitating material, and LiF, which is an electron injection-facilitating material, to a thickness of about 10 nm, and in a 1:1 volume % ratio.

That is, the first layer of the electron-transport layer/the second layer of the electron-transport layer may be deposited as follows:

Balq:$Alq_3$(5:5)/$BeBq_2$:LiF(1:1)　　　　　Device J 25 nm 10 nm

6) Next, a cathode is formed by applying aluminum (Al) on the second layer of the electron-transport layer to a thickness of about 150 nm.

Figure 24:
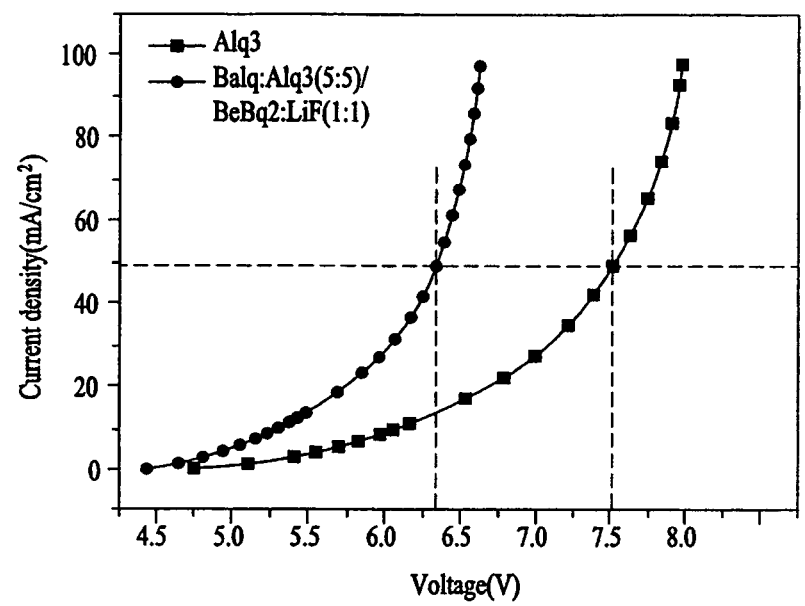
FIGS. 24 and 25 are graphs comparing IVL characteristics with respect to a Balq:Alq(5:5)/BeBq$_2$:LiF(1:1) electron-transport layer.
Figure 25:
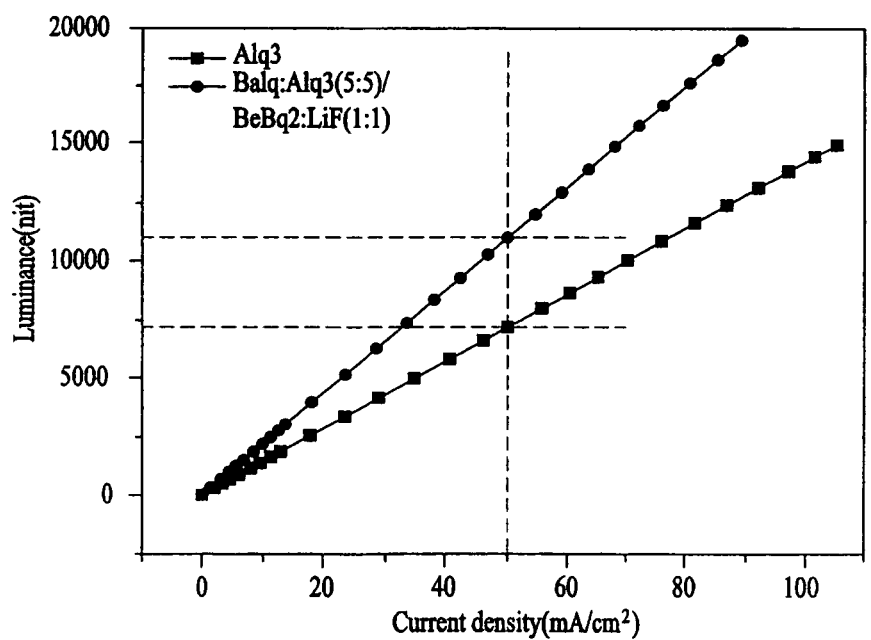

The thus-fabricated Device J, as shown in FIGS. 24 and 25, exhibited superior properties due to the combined characteristics of the first layer of the electron-transport layer and the second layer of the electron-transport layer.

Table 5 below shows comparison of characteristics between the respective devices at a current density of 50 $mA/cm^2$.

TABLE 5

|  | ETL | Voltage (V) | Luminance (nit) | cd/A | lm/W | Efficiency (%) |
|---|---|---|---|---|---|---|
| Device A | $Alq_3$ | 7.5 | 6712 | 13.4 | 5.6 | Ref |
| Device J | Balq:$Alq_3$(5:5)/$BeBq_2$:LiF | 6.3 | 11650 | 23.3 | 11.6 | 207 |

As can be seen from Table 5, where the first layer of the electron-transport layer and the second layer of the electron-transport layer were separately applied, efficiency of the devices were increased by a maximum of 140%, respectively. In contrast, where the first and second layers of the electron-transport layer were simultaneously applied as in Device J, it was possible to achieve improved efficiency of the device about 200% greater than Device A.

Example 7

Example 7 illustrates another example in which the electron-transport layer as discussed about with respect to Example 3 and the second layer of the electron-transport layer as discussed above with respect to Example 5 are simultaneously applied.

1) First, an ITO anode is formed on a transparent substrate, and a hole-injection layer (HIL) is formed by applying copper phthalocyanine (CuPc) on the anode to a thickness of about 25 nm.

2) A hole-transport layer (HTL) is formed by applying 4,4'bis[N-(1-naphthyl)-N-phenyl-amino]biphenyl (NPD) on the HIL to a thickness of about 35 nm.

3) In order to prepare a green-emitting layer, 8-hydroxyquinoline aluminum ($Alq_3$), doped with about 1% C545T, is applied on the HTL to a thickness of about 25 nm.

4) Next, a first layer of an electron-transport layer (ETL) is formed on the emitting layer. The first layer of the electron-transport layer is formed by co-deposition of Balq, which is a hole-blocking material (HBM), and $BeBq_2$, which facilitates electron transportation to the emitting layer, to a thickness of about 25 nm, and in a 5:5 volume % ratio.

5) Next, a second layer of an electron-transport layer is formed on the first layer of the electron-transport layer. The second layer of the electron-transport layer is formed by co-deposition of $BeBq_2$, which is an electron-transport-facilitating material, and LiF, which is an electron injection-facilitating material, to a thickness of about 10 nm, and in a 1:1 volume % ratio.

That is, the first layer of the electron-transport layer/the second layer of the electron-transport layer may be deposited as follows:

Balq:BeBq$_2$(5:5)/BeBq$_2$:LiF(1:1)   Device K 25 nm 10 nm

6) Next, a cathode is formed by applying aluminum (Al) on the second layer of the electron transport layer to a thickness of about 150 nm.

The thus-fabricated Device K exhibited superior properties due to the combined characteristics of the first layer of the electron-transport layer and the second layer of the electron-transport layer.

Table 6 below shows comparison of characteristics between the respective devices at a current density of 50 mA/cm$^2$.

TABLE 6

| ETL | Voltage (V) | Luminance (nit) | cd/A | lm/W | Efficiency (%) |
|---|---|---|---|---|---|
| Device A | Alq$_3$ | 7.5 | 6712 | 13.4 | 5.6 | Ref |
| Device K | Balq:BeBq$_2$(5:5)/ BeBq$_2$:LiF | 6 | 12750 | 25.5 | 13.4 | 238 |

As can be seen from Table 6, where the first layer of the electron-transport layer and the second layer of the electron-transport layer were separately applied, efficiency of the devices were increased by a maximum of 140%, respectively. In contrast, where the first and second layers of the electron-transport layer were simultaneously applied as in Device K, it was possible to achieve improved efficiency of the device about 230% greater than Device A.

Figure 26:
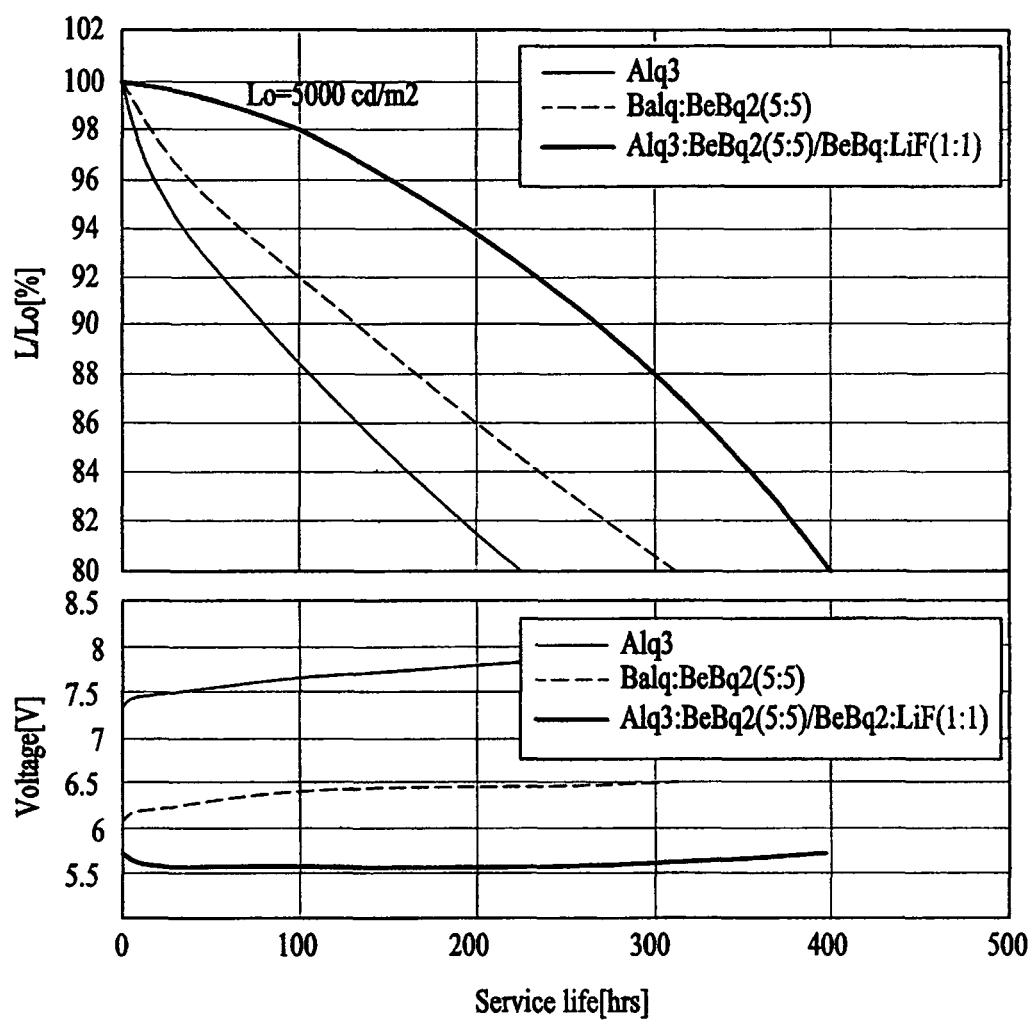
FIG. 26 is a graph comparing service lives of devices with respect to materials used in an electron-transport layer.

Upon comparing service lives between Devices A and K, it can be seen that Device K, as shown in FIG. 26, exhibited a significantly improved service life while achieving a luminance of 5000 nit and had an improved service life as compared to the Device F in Example 3.

Example 8

Example 8 illustrates another example in which the electron-transport layer as discussed above with respect to Example 3 and the second layer of the electron-transport layer as discussed above with respect to Example 5 are simultaneously applied.

1) First, an ITO anode is formed on a transparent substrate, and a hole-injection layer (HIL) is formed b y applying copper phthalocyanine (CuPc) on the anode to a thickness of about 25 nm.

2) A hole-transport layer (HTL) is formed by applying 4,4'bis[-(1-naphthyl)-N-phenyl-amino]biphenyl (NPD) on the HIL to a thickness of about 35 nm.

3) In order to prepare a green-emitting layer, 8-hydroxyquinoline aluminum (Alq$_3$), doped with about 1% C545T, is applied on the HTL to a thickness of about 25 nm.

4) Next, a first layer of an electron-transport layer (ETL) is formed on the emitting layer. The first layer of the electron-transport layer is formed by co-deposition of BCP, which is a hole-blocking material (HBM), and BeBq$_2$ which facilitates electron transportation to the emitting layer, to a thickness of about 25 nm, and in a 5:5 volume % ratio.

5) Next, a second layer of an electron-transport layer is formed on the first layer of the electron-transport layer. The second layer of the electron-transport layer is formed by co-deposition of BeBq$_2$, which is an electron-transport-facilitating material, and LiF, which is an electron injection-facilitating material, to a thickness of about 10 nm, and in a 1:1 volume % ratio.

That is, the first layer of the electron-transport layer/the second layer of the electron-transport layer may be deposited as follows:

BCP:BeBq$_2$(5:5)/BeBq$_2$:LiF(1:1)   Device L 25 nm 10 nm

6) Next, a cathode is formed by applying aluminum (Al) on the second layer of electron-transport layer to a thickness of about 150 nm.

The thus-fabricated Device L exhibited superior properties due to the combined characteristics of the first layer of the electron-transport layer and the second layer of the electron-transport layer.

Table 7 below shows comparison of characteristics between the respective devices at a current density of 50 mA/cm$^2$.

TABLE 7

| ETL | Voltage (V) | Luminance (nit) | cd/A | lm/W | Efficiency (%) |
|---|---|---|---|---|---|
| Device A | Alq$_3$ | 7.5 | 6712 | 13.4 | 5.6 | Ref |
| Device L | BCP:BeBq$_2$(5:5)/ BeBq$_2$:LiF | 5.8 | 13600 | 27.2 | 14.7 | 262 |

As can be seen from Table 7, where the first layer of the electron-transport layer and the second layer of the electron-transport layer were separately applied, efficiency of the devices was increased by a maximum of 140%, respectively. In contrast, where the first and second layers of the electron-transport layer were simultaneously applied as in Device L, it was possible to achieve improved efficiency of the device about 260% greater than Device A.

Example 9

Example 9 illustrates an example using a single material as a first layer of an electron-transport layer and using a mixed material as a second layer of the electron-transport layer.

1) An ITO anode is formed on a transparent substrate, and a hole-injection layer (HIL) is formed by applying copper phthalocyanine (CuPc) on the anode to a thickness of about 25 nm.

2) A hole-transport layer (HTL) is formed by applying 4,4'bis[N-(1-naphthyl)-N-phenyl-amino]biphenyl (NPD) on the HIL to a thickness of about 35 nm.

3) In order to prepare a green-emitting layer, 8-hydroxyquinoline aluminum (Alq$_3$), doped with about 1% C545T, is applied on the HTL to a thickness of about 25 nm.

4) A first layer of an electron-transport layer (ETL) is formed on the emitting layer. The first layer of the electron-transport layer has a thickness of about 10 nm, using Balq as a hole-blocking material (HBM).

5) A second layer of an electron-transport layer is formed on the first layer of the electron-transport layer. The second layer of the electron-transport layer is formed by co-deposition of BeBq$_2$, which is an electron-transport-facilitating material, and LiF, which is an electron injection-facilitating material, to a thickness of about 25 nm, and in a 1:1 volume % ratio.

That is, the first layer of the electron-transport layer/the second layer of the electron-transport layer may be deposited as follows:

Balq/BeBq$_2$:LiF(1:1)　　　　　　　　　　　　Device M 10 nm 25 nm

6) A cathode is formed by applying Aluminum (Al) on the second layer of the electron-transport layer to a thickness of about 150 nm.

The thus-fabricated Device M exhibited superior properties due to the combined characteristics of the first layer of the electron-transport layer and the second layer of the electron-transport layer.

Table 8 below shows comparison of characteristics between the respective devices at a current density of 50 mA/cm$^2$.

TABLE 8

| | ETL | Voltage (V) | Luminance (nit) | cd/A | lm/W | Efficiency (%) |
|---|---|---|---|---|---|---|
| Device A | Alq$_3$ | 7.5 | 6712 | 13.4 | 5.6 | Ref |
| Device M | Balq/BeBq$_2$:LiF | 7.5 | 9500 | 19.0 | 8.0 | 142 |

As can be seen from Table 8, Device M exhibited improved efficiency of about 140% when compared to that of Device A.

As such, an organic EL device in accordance with the present invention and the method for fabricating the same provide significantly improved service life and efficiency of the device via simultaneous application of the first layer of the electron-transport layer in which a hole-blocking material and an electron-transporting material are mixed and the second layer of the electron-transport layer in which the electron-transporting material and a material facilitating electron-transport or electron-injection are mixed.

Further, the present invention enables simplification of a process for manufacturing phosphorescent-fluorescent hybrid devices, via use of the electron-transport layer composed of the first layer in which the hole-blocking material and an electron-transporting material are mixed and the second layer in which the electron-transporting material and a material facilitating electron-transport or electron-injection are mixed.

The electroluminescent device of the present invention may be used in or formed as a flexible display for electronic books, newspapers, magazines, and the like, different types of portable devices, handsets, MP3 players, notebook computers, and the like, audio applications, navigation applications, televisions, monitors, or other types of devices using a display, either monochrome or color.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An electroluminescent (EL) device, comprising:
a stack structure comprising
a hole injection layer,
a hole transport layer,
an emitting layer and
an electron-transport layer sequentially between a first electrode and a second electrode, wherein the electron-transport layer comprises:
a first layer directly on the emitting layer as a single layer, the first layer comprising a mixture selected from a ratio of 3:7 to 7:3 of Balq (aluminum(III) bis(2-methyl-8-quinolinato) 4-phenylphenolate) and Alq$_3$ [Tris-(8-hydroxyquinolinolato)-aluminum], a ratio of 5:5 of Balq and BeBq$_2$ [Bis(10-hydroxybenzo[h]quinolinato)beryllium], and a ratio of 5:5 of BCP(2,9-dimethyl-4,7-diphenyl-1,10-phenanthroline) and BeBq$_2$; and
a second layer contacted with the second electrode as a single layer, the second layer formed of a mixture of BeBq$_2$ and LiF on the first layer,
wherein the electron-transport layer including the first layer and the second layer has a thickness of approximately 35 nm, and
wherein the emitting layer includes at least one phosphorescent material.

2. The device of claim 1, wherein at least one of the first electrode and the second electrode is formed of a transparent material.

3. A full-color organic electroluminescent (EL) device comprising a stack structure comprising
a hole injection layer,
a hole transport layer,
an emitting layer and
an electron-transport layer sequentially between an anode and a cathode, wherein the emitting layer includes at least one phosphorescent material, and wherein the electron-transport layer comprises:
a first layer positioned directly on the emitting layer as a single layer, the first layer comprising a mixture selected from a ratio of 3:7 to 7:3 of Balq and Alq$_3$, a ratio of 5:5 of Balq and BeBq$_2$, and a ratio of 5:5 of BCP and BeBq$_2$; and
a second layer contacted with the cathode, wherein the second layer is formed of a mixture of BeBq$_2$ and LiF as a single layer on the first layer,
wherein the electron-transport layer including the first layer and the second layer has a thickness of approximately 35 nm, and
wherein the emitting layer includes at least one phosphorescent material.

4. An organic electroluminescent (EL) device, comprising:
a plurality of emitting units each including
a hole injection layer,
a hole transport layer,
an emitting layer and
an electron-transport layer positioned sequentially between an anode and a cathode, wherein adjacent emitting units are separated by interlayers, and wherein the electron-transport layer comprises:
a first layer positioned directly on the emitting layer as a single layer, the first layer comprising a mixture selected from a ratio of 3:7 to 7:3 of Balq and Alq$_3$ and, a ratio of 5:5 of Balq and BeBq$_2$, and a ratio of 5:5 of BCP and BeBq$_2$; and a second layer contacted with the cathode, wherein the second layer is formed of a mixture of BeBq$_2$ and LiF as a single layer on the first layer, wherein the electron-transport layer including the first layer and the second layer has a thickness of approximately 35 nm, and wherein the emitting layer includes at least one phosphorescent material.

5. The device of claim 4, wherein the plurality of light-emitting units comprise the same stack structures or different stack structures.

6. A method of fabricating an organic electroluminescent (EL) device, the method sequentially comprising:

forming a first electrode on a substrate;

forming a hole injection layer and a hole transport layer on the first electrode;

forming an emitting layer including at least one phosphorescent material;

forming, directly on the entire emitting layer, an electron-transport layer comprising a first layer which is a mixture selected from a ratio of 3:7 to 7:3 of Balq and Alq$_3$ and, a ratio of 5:5 of Balq and BeBq$_2$, and a ratio of 5:5 of BCP and BeBq$_2$, and a second layer which is a mixture of BeBq$_2$ and LiF on the first layer, wherein the first layer and the second layer are single layers, respectively; and forming a second electrode directly on the second layer of the electron-transport layer, wherein the electron-transport layer has a thickness of approximately 35 nm, and wherein the emitting layer includes at least one phosphorescent material.

7. The method of claim 6, wherein the first electrode is an anode, and the second electrode is a cathode.

* * * * *